(12) United States Patent
Owa et al.

(10) Patent No.: US 9,063,436 B2
(45) Date of Patent: Jun. 23, 2015

(54) EXPOSURE APPARATUS, EXPOSURE METHOD, AND METHOD FOR PRODUCING DEVICE

(75) Inventors: Soichi Owa, Kumagaya (JP); Hiroyuki Nagasaka, Kumagaya (JP); Ryu Sugawara, Kounosu (JP)

(73) Assignee: NIKON CORPORATION, Tokyo (JP)

( * ) Notice: Subject to any disclaimer, the term of this patent is extended or adjusted under 35 U.S.C. 154(b) by 630 days.

(21) Appl. No.: 13/427,512

(22) Filed: Mar. 22, 2012

(65) Prior Publication Data

US 2012/0176589 A1   Jul. 12, 2012

Related U.S. Application Data

(63) Continuation of application No. 11/659,321, filed as application No. PCT/JP2005/014011 on Aug. 1, 2005, now Pat. No. 8,169,591.

(30) Foreign Application Priority Data

Aug. 3, 2004 (JP) ................................ 2004-227226
Mar. 18, 2005 (JP) ................................ 2005-079113

(51) Int. Cl.
   *G03F 7/20* (2006.01)

(52) U.S. Cl.
   CPC .......... *G03F 7/7085* (2013.01); *G03F 7/70341* (2013.01); *G03F 7/70716* (2013.01)

(58) Field of Classification Search
   CPC   G03F 7/70341; G03F 7/70716; G03F 7/7085
   USPC .................................................... 355/30, 53
   See application file for complete search history.

(56) References Cited

U.S. PATENT DOCUMENTS

| 4,346,164 A | 8/1982 | Tabarelli et al. |
| 4,480,910 A | 11/1984 | Takanashi et al. |
| 4,505,569 A | 3/1985 | Seto et al. |
| 4,801,352 A | 1/1989 | Piwczyk |
| 4,931,050 A | 6/1990 | Idriss |

(Continued)

FOREIGN PATENT DOCUMENTS

| CN | 1514307 A | 7/2004 |
| DE | 206 607 | 2/1984 |

(Continued)

OTHER PUBLICATIONS

Mar. 23, 2011 Office Action issued in Japanese Patent Application No. 2005-136902 (with translation).

(Continued)

*Primary Examiner* — Steven H Whitesell Gordon
(74) *Attorney, Agent, or Firm* — Oliff PLC

(57) ABSTRACT

An exposure apparatus is provided with a projection optical system, and the projection optical system includes a first optical element disposed most closely to an image plane of the projection optical system. The exposure apparatus includes a first liquid immersion mechanism which forms a first liquid immersion area of a first liquid between the first optical element and an upper surface of a transparent member provided on a side of the image plane of the projection optical system, and an observation unit which observes a state of the first liquid immersion area. It is possible to grasp the state of the liquid immersion area of the liquid, thereby executing optimum liquid immersion exposure.

19 Claims, 18 Drawing Sheets

(56) References Cited

U.S. PATENT DOCUMENTS

| | | | |
|---|---|---|---|
| 5,493,403 | A | 2/1996 | Nishi |
| 5,528,118 | A | 6/1996 | Lee |
| 5,559,338 | A | 9/1996 | Elliott et al. |
| 5,610,683 | A | 3/1997 | Takahashi |
| 5,623,853 | A | 4/1997 | Novak et al. |
| 5,715,039 | A | 2/1998 | Fukuda et al. |
| 5,815,256 | A | 9/1998 | Fukunaga |
| 5,825,043 | A | 10/1998 | Suwa |
| 5,870,223 | A | 2/1999 | Tomimatsu |
| 5,874,820 | A | 2/1999 | Lee |
| 5,885,134 | A | 3/1999 | Shibata et al. |
| 5,959,441 | A | 9/1999 | Brown |
| 5,997,963 | A | 12/1999 | Davison et al. |
| 6,208,407 | B1 | 3/2001 | Loopstra |
| 6,341,007 | B1 | 1/2002 | Nishi et al. |
| 6,362,887 | B1 | 3/2002 | Meisberger |
| 6,400,441 | B1 | 6/2002 | Nishi et al. |
| 6,496,257 | B1 * | 12/2002 | Taniguchi et al. ......... 356/239.2 |
| 6,549,269 | B1 | 4/2003 | Nishi et al. |
| 6,563,565 | B2 | 5/2003 | Nishi |
| 6,590,634 | B1 | 7/2003 | Nishi et al. |
| 6,741,331 | B2 | 5/2004 | Boonman et al. |
| 6,897,963 | B1 | 5/2005 | Taniguchi et al. |
| 7,061,575 | B2 | 6/2006 | Taniguchi et al. |
| 7,177,006 | B2 | 2/2007 | Tokita |
| 7,460,207 | B2 | 12/2008 | Mizutani et al. |
| 8,169,591 | B2 | 5/2012 | Owa et al. |
| 2001/0004903 | A1 | 6/2001 | Ohmi et al. |
| 2001/0013580 | A1 | 8/2001 | Buis et al. |
| 2004/0020782 | A1 | 2/2004 | Cohen et al. |
| 2004/0055803 | A1 | 3/2004 | Patmont |
| 2004/0160582 | A1 | 8/2004 | Lof et al. |
| 2004/0165159 | A1 | 8/2004 | Lof et al. |
| 2004/0178362 | A1 | 9/2004 | Gilissen et al. |
| 2004/0207824 | A1 * | 10/2004 | Lof et al. .................. 355/30 |
| 2004/0263809 | A1 | 12/2004 | Nakano |
| 2005/0024609 | A1 * | 2/2005 | De Smit et al. ............. 355/18 |
| 2005/0030497 | A1 | 2/2005 | Nakamura |
| 2005/0037269 | A1 | 2/2005 | Levinson |
| 2005/0041225 | A1 | 2/2005 | Sengers et al. |
| 2005/0074704 | A1 | 4/2005 | Endo et al. |
| 2005/0134817 | A1 | 6/2005 | Nakamura |
| 2005/0219490 | A1 | 10/2005 | Owa |
| 2005/0237504 | A1 | 10/2005 | Nagasaka et al. |
| 2005/0264774 | A1 | 12/2005 | Mizutani et al. |
| 2005/0264778 | A1 | 12/2005 | Lof et al. |
| 2005/0264780 | A1 | 12/2005 | Graeupner |
| 2006/0077367 | A1 | 4/2006 | Kobayashi et al. |
| 2006/0126043 | A1 | 6/2006 | Mizutani et al. |
| 2006/0126044 | A1 | 6/2006 | Mizutani et al. |
| 2007/0216889 | A1 | 9/2007 | Nishii |

FOREIGN PATENT DOCUMENTS

| | | |
|---|---|---|
| DE | 221 563 A1 | 4/1985 |
| DE | 224 448 A1 | 7/1985 |
| DE | 197 44 246 A1 | 4/1999 |
| EP | 0 422 814 A2 | 4/1991 |
| EP | 0 509 797 A2 | 10/1992 |
| EP | 0 605 103 A1 | 7/1994 |
| EP | 1 018 669 A2 | 7/2000 |
| EP | 1 041 357 A1 | 10/2000 |
| EP | 1 241 467 A2 | 9/2002 |
| EP | 1 420 298 A2 | 5/2004 |
| EP | 1 420 299 A2 | 5/2004 |
| EP | 1 429 188 A2 | 6/2004 |
| EP | 1 480 258 A1 | 11/2004 |
| EP | 1 486 827 A2 | 12/2004 |
| EP | 1 494 079 A1 | 1/2005 |
| EP | 1 498 778 A1 | 1/2005 |
| EP | 1 524 558 A1 | 4/2005 |
| EP | 1 528 431 A2 | 5/2005 |
| EP | 1 528 433 A2 | 5/2005 |
| EP | 1 571 695 A1 | 9/2005 |
| EP | 1 571 697 A1 | 9/2005 |
| EP | 1 571 699 A1 | 9/2005 |
| EP | 1 571 701 A1 | 9/2005 |
| EP | 1 628 329 A1 | 2/2006 |
| EP | 1 635 382 A1 | 3/2006 |
| EP | 1 650 787 A1 | 4/2006 |
| EP | 1 783 822 | 5/2007 |
| FR | 2 847 670 A1 | 5/2004 |
| JP | A-57-117238 | 7/1982 |
| JP | A-58202448 | 11/1983 |
| JP | A-59-19912 | 2/1984 |
| JP | A-62-65326 | 3/1987 |
| JP | A-63-157419 | 6/1988 |
| JP | A-04-065603 | 3/1992 |
| JP | A-4-305915 | 10/1992 |
| JP | A-4-305917 | 10/1992 |
| JP | A-5-62877 | 3/1993 |
| JP | A-06-053120 | 2/1994 |
| JP | A-06-124873 | 5/1994 |
| JP | A-6-124873 | 5/1994 |
| JP | A-06-168866 | 6/1994 |
| JP | A-06-188169 | 7/1994 |
| JP | A-07-176468 | 7/1995 |
| JP | A-7-220990 | 8/1995 |
| JP | A-08-037149 | 2/1996 |
| JP | A-08-166475 | 6/1996 |
| JP | A-8-316125 | 11/1996 |
| JP | A-08-330229 | 12/1996 |
| JP | A-9-072943 | 3/1997 |
| JP | A-10-163099 | 6/1998 |
| JP | A-10-214783 | 8/1998 |
| JP | A-10-303114 | 11/1998 |
| JP | A-10-335235 | 12/1998 |
| JP | A-10-335236 | 12/1998 |
| JP | A-10-340846 | 12/1998 |
| JP | A-11-016816 | 1/1999 |
| JP | A-11-126747 | 5/1999 |
| JP | A-11-135400 | 5/1999 |
| JP | A-11-135428 | 5/1999 |
| JP | A-11-142418 | 5/1999 |
| JP | A-11-176727 | 7/1999 |
| JP | H11-283903 | 10/1999 |
| JP | A-2000-58436 | 2/2000 |
| JP | A-2000-505958 | 5/2000 |
| JP | A-2001-167997 | 6/2001 |
| JP | A-2002-014005 | 1/2002 |
| JP | A-2002-246309 | 8/2002 |
| JP | A-2002-343706 | 11/2002 |
| JP | A-2004-193252 | 7/2004 |
| JP | A 2004-207696 | 7/2004 |
| JP | A-2004-207696 | 7/2004 |
| JP | A-2004-207711 | 7/2004 |
| JP | A-2004-289126 | 10/2004 |
| JP | A-2005-5713 | 1/2005 |
| JP | A-2005-116571 | 4/2005 |
| JP | A-2005-136374 | 5/2005 |
| JP | A-2005-191394 | 7/2005 |
| JP | A-2005-209705 | 8/2005 |
| JP | A-2006-019720 | 1/2006 |
| JP | 2002-365027 | 12/2012 |
| KR | 2003-0002514 | 1/2003 |
| WO | WO 99/49504 A1 | 9/1999 |
| WO | WO 01/67505 A2 | 9/2001 |
| WO | WO 2003/065427 A1 | 8/2003 |
| WO | WO 2004/019128 | 3/2004 |
| WO | WO 2004/019128 A2 | 3/2004 |
| WO | WO 2004/053596 A2 | 6/2004 |
| WO | WO 2004/053950 A1 | 6/2004 |
| WO | WO 2004/053953 A1 | 6/2004 |
| WO | WO 2004/053955 A1 | 6/2004 |
| WO | WO 2004/053958 A1 | 6/2004 |
| WO | WO 2004053954 A1 * | 6/2004 |
| WO | WO 2004/093160 A2 | 10/2004 |
| WO | WO 2004090577 A2 * | 10/2004 |
| WO | WO 2004/105107 A1 | 12/2004 |

(56) References Cited

FOREIGN PATENT DOCUMENTS

WO    WO 2005/010611 A2    2/2005
WO    WO 2005/010960 A1    2/2005

OTHER PUBLICATIONS

John H. Burnett, et al., "High-Index Material for 193 nm Immersion Lithography", Proceedings of SPIE, May 2005, vol. 5754, pp. 611-621.
Feb. 27, 2013 Summons to attend oral proceedings pursuant to Rule 115(1) of European Patent No. 1791164.
Office Action dated Apr. 1, 2014 issued in Chinese Patent Application No. 201210468689.1 (W/English Translation).
Interlocutory Decision in Opposition Proceeds dated Dec. 20, 2013 issued in European Patent Application No. 05767342.8.
Minutes of the Oral Proceedings before the Opposition Divisions dated Dec. 20, 2013 issued in European Patent Application No. 05767342.8.
Jun. 4, 2012 Office Action issued in Japanese Patent Application No. 2011-032385 (with translation).
Sep. 30, 2013 Office Action issued in Taiwanese Patent Application No. 094126326 (with English translation).
International Preliminary Report on Patentability issued in International Application No. PCT/JP2005/014011 on Feb. 6, 2007 (with translation).
European Office Action issued in European Patent Application No. 05767342.8 on Nov. 24, 2009.
European Search Report issued in European Patent Application No. 05767342.8 on Nov. 12, 2008.
International Search Report issued in International Application No. PCT/JP2005/014011 on Nov. 8, 2005.
Decision to grant European patent issued in European Patent Application No. 05767342.8 on May 7, 2010.
Dec. 20, 2010 Office Action issued Japanese Patent Application No. 2005-217188 (English Translation).
Nov. 11, 2010 Office Action issued in Chinese Patent Application No. 201010129961.4 (with English Translation).
Apr. 11, 2008 Notice of Reasons for Rejection issued in Chinese Patent Application No. 2005-800236013 (with partial English translation).
Mar. 16, 2011 Notice of Reasons for Rejection issued in Chinese Patent Application No. 2010-10129961.4 (with partial English translation).
Jun. 30, 2011 Office Action issued in Korean Patent Application No. 2007-7002662 (with English Translation).
Communication of a Notice of Opposition issued for EP Patent Application No. 05767342.8 dated Mar. 24, 2011.
Zhu Y. et al., "Rapid Measurement of Bubble Size in Gas-Liquid Flows Using a Bubble Detection Technique", 14th Australian Fluid Mechanics Conference, Dec. 10-14, 2001, pp. 541-544.
Gau T. et al., "Image Characterization of bubbles in water for 193-nm immersion lithography—far-field approach", Journal of Microlithography, Microfabrication and Microsystems, vol. 3, No. 1, pp. 61-67, published Jan. 2004.
Yongfa Fan et al., "Study of Air Bubble Induced Light Scattering Effect on Image Quality in 193 nm Immersion Lithography", Proceedings of SPIE, vol. 5377, pp. 477-486, published May 28, 2004.
John H. Burnett et al., "High Index Materials for 193 nm and 157 nm Immersion Lithography" International Symposium on Immersion & 157nm Lithography, Vancouver, Aug. 2, 2004.
Owa S. et al., "Imersion lithography: its potential performances and issues" Proceeding of the SPIE, SPIE, vol. 5040, Feb. 28, 2003, pp. 724-733.
Streefkerk et al., "Extending Optical Lithography with Immersion" Optical Microlithography XVII, edited by Bruce W. Smith, Proceedings of SPIE vol. 5377, published Feb. 2004, pp. 285-305.
Communication pursuant to Article 94(3) EPC for EP Patent Application No. 05767342.8 dated Mar. 24, 2009.
Jan. 20, 2012 Notice of Grounds for Rejection for KR Appln. No. 2011-7031692 w/translation.
Aug. 31, 2011 Notice of Allowance issued in U.S. Appl. No. 11/659,321.
Dec. 29, 2011 Notice of Allowance issued in U.S. Appl. No. 11/659,321.
Dec. 6, 2012 Office Action issued in U.S. Appl. No. 11/659,321.
Mar. 18, 2010 Office Action issued in U.S. Appl. No. 11/659,321.
Mar. 19, 2013 Examination Report issued in Taiwanese Patent Application No. 094126326 (with English Translation).
Nov. 21, 2014 Search Report issued in European Patent Application No. 10160835.4.

\* cited by examiner

EXPOSURE APPARATUS, EXPOSURE METHOD, AND METHOD FOR PRODUCING DEVICE

This is a continuation of application Ser. No. 11/659,321 filed Apr. 25, 2007 (now U.S. Pat. No. 8,169,591), which is a PCT National Stage of Application No. PCT/JP2005/014011 filed Aug. 1, 2005. The disclosure of the prior applications is hereby incorporated by reference herein in its entirety.

TECHNICAL FIELD

The present invention relates to an exposure apparatus for exposing a substrate through a liquid, and a method for producing a device.

BACKGROUND ART

Semiconductor devices and liquid crystal display devices are produced by the so-called photolithography technique in which a pattern formed on a mask is transferred onto a photosensitive substrate. An exposure apparatus to be used in this photolithography process includes a mask stage for supporting a mask and a substrate stage for supporting a substrate, and transfers a pattern of the mask onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda/NA \quad (1)$$

$$\delta = \pm k_2 \cdot \lambda/NA^2 \quad (2)$$

In the expressions, λ represents the exposure wavelength, NA represents the numerical aperture of the projection optical system, and k1 and k2 represent the process coefficients. According to the expressions (1) and (2), the following fact is appreciated. That is, when the exposure wavelength λ is shortened and the numerical aperture NA is increased in order to enhance the resolution R, then the depth of focus δ is narrowed.

If the depth of focus δ is too narrowed, it is difficult to match the substrate surface with respect to the image plane of the projection optical system. It is feared that the focus margin is insufficient during the exposure operation. Accordingly, the liquid immersion method has been suggested, which is disclosed, for example, in Pamphlet of International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent to form a liquid immersion area so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases).

DISCLOSURE OF THE INVENTION

Problem to be Solved by the Invention

To satisfactorily perform an exposure process based on a liquid immersion method, it is essential to maintain a liquid immersion area in a desired state. Therefore, it is desirable that the exposure process is performed after grasping the state of the liquid immersion area and confirming that the liquid immersion area is in the desired state.

The present invention has been made taking the foregoing circumstances into consideration, and an object thereof is to provide an exposure apparatus and an exposure method with which the state of the liquid immersion area can be grasped and a method for producing a device using the exposure apparatus and the exposure method.

Means for solving the problem

In order to achieve the object as described above, the present invention adopts the following constructions.

According to a first aspect of the invention, there is provided an exposure apparatus which exposes a substrate through a liquid in a liquid immersion area, the exposure apparatus comprising: a projection optical system including a first optical element disposed most closely to an image plane of the projection optical system; a liquid immersion mechanism which forms the liquid immersion area of the liquid in a space between the first optical element and a predetermined surface provided on a side of an image plane of the projection optical system; and an observation unit which observes a state of the liquid immersion area.

According to a second aspect of the invention, there is provided an exposure apparatus which exposes a substrate through a liquid in a liquid immersion area, the exposure apparatus comprising: a projection optical system including a first optical element disposed most closely to an image plane of the projection optical system and a second optical element disposed second most closely to the image plane with respect to the first optical element; a liquid immersion mechanism which forms the liquid immersion area of the liquid in a space between the first optical element and the second optical element; and an observation unit which observes a state of the liquid immersion area.

According to a third aspect of the invention, there is provided an exposure apparatus which exposes a substrate through a liquid in a liquid immersion area, the exposure apparatus comprising: an optical element; a liquid immersion mechanism which fills, with the liquid, a space between the optical element and a predetermined surface disposed on a light-outgoing side of the optical element; and an observation unit which observes a state of the liquid in the space between the optical element and the predetermined surface.

According to the first through third aspects of the invention, an observation unit which observes the state of the liquid immersion area is provided, so that it can be confirmed whether the formed liquid immersion area is in a desired state, based on the result of observation performed by the observation unit. Then, by exposing, for example, a substrate after it is judged that the foamed liquid immersion area is in the desired state based on the result of observation performed by the observation unit, the substrate can be satisfactorily exposed through the liquid in the liquid immersion area. On the other hand, when it is judged that the formed liquid immersion area is not in the desired state based on the result of observation performed by the observation unit, an appropriate procedure for obtaining the desired state of the liquid immersion area, for example, exchange of the liquid can be performed.

According to a fourth aspect of the invention, there is provided a method for producing a device using the exposure apparatus according to any one of the above-described aspects.

According to the fourth aspect of the invention, after confirming that the formed liquid immersion area is in the desired state, an exposure process for producing a device via the liquid in the liquid immersion area and a measuring process can be satisfactorily performed. Therefore, a device having desired performance can be provided.

According to a fifth aspect of the invention, there is provided an exposure method for exposing a substrate through a liquid in the liquid immersion area fowled on a light-outgoing side of an optical element, the method comprising: performing exposure for the substrate through the liquid in the liquid immersion area; performing exchange of the substrate which has been exposed with an unexposed substrate; and performing detection of a gas portion in the liquid in the liquid immersion area during the exchange of the substrate.

According to the fifth aspect of the invention, by detecting a gas portion in the liquid in the liquid immersion area, the state of the liquid immersion area is grasped, and by taking a proper necessary measure or performing treatment for the liquid immersion area, a sufficient liquid immersion area can be maintained. The gas portion is detected when exchanging the substrate, so that the detection of the gas portion does not affect the exposure operation, and a desired throughput of the exposure apparatus can be maintained. The term "gas portion in the liquid" includes not only bubble in the liquid but also void in the liquid.

According to a sixth aspect of the invention, there is provided a method for producing a device, comprising: exposing a substrate by the exposure method of the invention; developing the exposed substrate; and processing the developed substrate. Since this method for producing a device adopts the exposure method of the invention, a device having desired performance can be provided.

Effects of the Invention

According to the invention, a substrate can be satisfactorily exposed after confirming that a liquid immersion area of a liquid is in a desired state by using an observation unit.

BEST MODE FOR CARRYING OUT THE INVENTION

In the following, embodiments of the invention will be described with reference to the drawings.

First Embodiment

Figure 1:
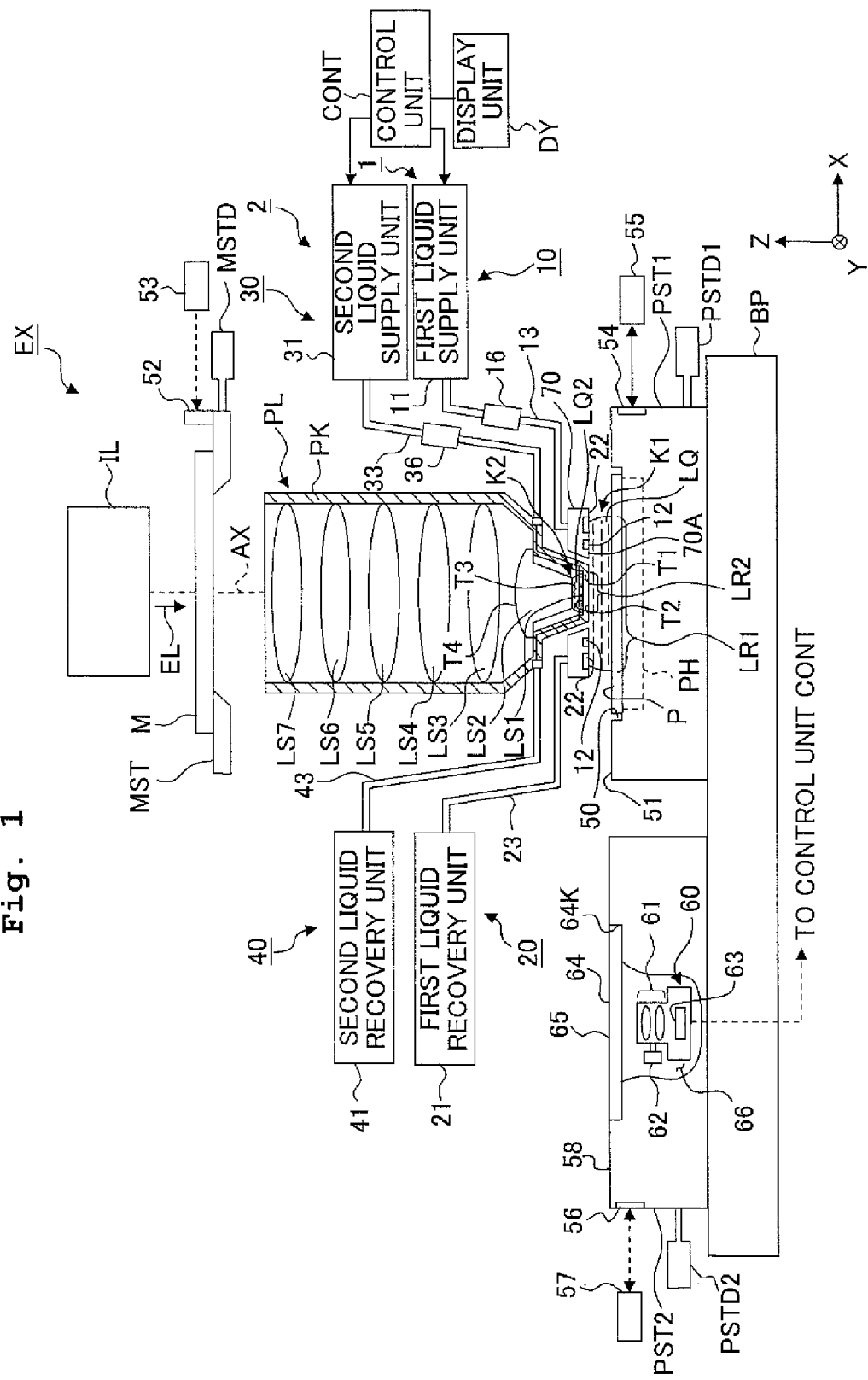
FIG. 1 is a schematic arrangement view illustrating an exposure apparatus according to a first embodiment.

FIG. 1 is a schematic arrangement view illustrating an exposure apparatus EX according to a first embodiment. In FIG. 1, the exposure apparatus EX includes a mask stage MST which is movable while supporting a mask M, a substrate stage PST1 which includes a substrate holder PH for holding a substrate P and is movable while holding the substrate P on the substrate holder PH, a measuring stage PST2 which holds a measuring instrument for performing measurements relating to an exposure process and is movable independently from the substrate stage PST1, an illumination optical system IL which illuminates the mask M supported on the mask stage MST with exposure light beam EL, a projection optical system PL which projects an image of a pattern of the mask M illuminated with the exposure light beam EL onto the substrate P supported on the substrate stage PST1, and a control unit CONT which collectively controls the overall operation of the exposure apparatus EX. To the control unit CONT, a display unit DY which displays information relating to an exposure process is connected.

The exposure apparatus EX of this embodiment is a liquid immersion exposure apparatus to which a liquid immersion method is applied in order that the exposure wavelength is substantially shortened to improve the resolution and the depth of focus is substantially widened, and includes a first liquid immersion mechanism 1 which forms a first liquid immersion area LR1 by filling a first liquid LQ1 in a space between the substrate P and a lower surface T1 of a first optical element LS1 disposed most closely to an image plane of the projection optical system PL among the optical elements LS1 to LS7 of the projection optical system PL. The first liquid immersion mechanism 1 includes a first liquid supply mechanism 10 which supplies the first liquid LQ1 between lower surface T1 of the first optical element LS1 and the substrate P, and a first liquid recovery mechanism 20 which recovers the first liquid LQ1 supplied by the first liquid supply mechanism 10. The operations of the first liquid immersion mechanism 1 are controlled by the control unit CONT.

In the vicinity of the side of the image plane of the projection optical system PL, specifically, in the vicinity of the optical element LS1 in the end portion on a side of an image plane of the projection optical system PL, a nozzle member 70 which constructs a part of the first liquid immersion mechanism 1 is disposed. The nozzle member 70 is an annular member provided so as to surround the end portion of the projection optical system PL at a position over or above the substrate P (substrate stage PST).

The exposure apparatus EX includes a second liquid immersion mechanism 2 which forms a second liquid immersion area LR2 by filling a second liquid LQ2 in a space between the first optical element LS1 and a second optical element LS2 disposed second most closely to the image plane of the projection optical system PL with respect to the first optical element LS1. The second optical element LS2 is arranged above or over the first optical element LS1, and the upper surface T2 of the first optical element LS1 is arranged so as to face a lower surface T3 of the second optical element LS2. The second liquid immersion mechanism 2 includes a second liquid supply mechanism 30 which supplies the second liquid LQ2 in a space between the first optical element LS1 and the second optical element LS2, and a second liquid recovery mechanism 40 which recovers the second liquid LQ2 supplied by the second liquid supply mechanism 30. The operations of the second liquid immersion mechanism 2 are controlled by the control unit CONT.

The exposure apparatus EX in this embodiment adopts a local liquid immersion method in which the first liquid immersion area LR1 is locally formed on a part of the substrate P. The exposure apparatus EX also locally forms the second liquid immersion area LR2 on a part of the upper surface T2 of the first optical element LS1. The exposure apparatus EX forms the first liquid immersion area LR1 by filling the first liquid LQ1 in a space between the first optical element LS1 and the substrate P disposed on the side of the image plane of the first optical element LS1 by using the first liquid immersion mechanism 1, and forms the second liquid immersion area LR2 by filling the second liquid LQ2 in a space between the first optical element LS1 and the second optical element LS2 at least while an image of the pattern of the mask M is being transferred onto the substrate P.

In the measuring stage PST2, an observation unit 60 which can observe the states of the first liquid immersion area LR1 and the second liquid immersion area LR2, respectively, is provided. The observation unit 60 is provided inside the measuring stage PST2.

The embodiment of the present invention will now be explained as exemplified by a case using the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. In the following explanation, the X axis direction is the synchronous movement direction (scanning direction) of the mask M and the substrate P in a horizontal plane, the Y axis direction (non-scanning direction) is the direction orthogonal to the X axis direction in the horizontal plane, and the Z axis direction is the direction which is perpendicular to the X axis direction and the Y axis direction and is coincident with the optical axis AX of the projection optical system PL. The directions of rotation (inclination) about the X axis, the Y axis, and the Z axis are θX, θY, and θZ directions, respectively. The term "substrate" referred to herein includes substrates obtained by coating a semiconductor wafer surface with a resist, and the term "mask" includes a reticle formed with a device pattern to be subjected to the reduction projection onto the substrate.

The illumination optical system IL includes an exposure light source which radiates exposure light beam EL, an optical integrator which uniformizes the illuminance of the exposure light beam EL emitted from the exposure light source, a condenser lens which collects the exposure light beam EL from the optical integrator, a relay lens system, and a field diaphragm which sets an illumination area on the mask M to be illuminated with the exposure light beam EL. A predetermined illumination area on the mask M is illuminated with the exposure light beam EL having a uniform illuminance distribution by the illumination optical system IL. Those usable as the exposure light beam EL radiated from the exposure light source include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

In this embodiment, as the first liquid LQ1 to be supplied from the first liquid supply mechanism 10 and the second liquid LQ2 to be supplied from the second liquid supply mechanism 30, pure or purified water is used. Namely, in this embodiment, the first liquid LQ1 and the second liquid LQ2 are same liquid. Those transmissive through pure water include the ArF excimer laser beam as well as emission lines (g-ray, h-ray, i-ray) radiated, for example, from a mercury lamp and far ultraviolet light beams (DUV light beams) such as the KrF excimer laser beam (wavelength: 248 nm).

The mask stage MST is movable while holding the mask M, and is two-dimensionally movable in a plane perpendicular to the optical axis AX of the projection optical system PL, that is, two-dimensionally movable in the XY plane and finely rotatable in the θZ direction. The mask stage MST is driven by a mask stage driving mechanism MSTD including a linear motor. The mask stage driving mechanism MSTD is controlled by the control unit CONT. On the mask stage MST, a movement mirror 52 which moves together with the mask stage MST is provided. At a position opposite or opposed to the movement mirror 52, a laser interferometer 53 is provided. The position in the two-dimensional direction and the angle of rotation of the mask M on the mask stage MST are measured in real time by the laser interferometer 53, and the result of measurement is outputted to the control unit CONT. The control unit CONT operates to position the mask M supported on the mask stage MST by driving the mask stage driving mechanism MSTD based on the result of measurement of the laser interferometer 53.

The projection optical system PL projects the pattern of the mask M onto the substrate P at a predetermined projection magnification β. The projection optical system PL includes a plurality of optical elements LS1 to LS7 including the first optical element LS1 provided at the end portion on the substrate P side, and these optical elements LS1 to LS7 are supported by a barrel PK. In this embodiment, the projection optical system PL is the reduction system having the projection magnification β which is, for example, ¼, ⅕ or ⅛. The projection optical system PL may be any one of the 1× magnification system and the magnifying system. The projection optical system PL may be any one of a catadioptric system including dioptric and catoptric elements, a dioptric system including no catoptric element, and a cotaptric system including no dioptric element. The exposure light beam EL radiated from the illumination optical system IL is made incident on or comes into the projection optical system PL from the side of the object plane, and after passing through the plurality of optical elements LS7 to LS1, the exposure light beam EL is radiated from the side of the image plane of the projection optical system PL and arrives at the surface of the substrate P. Specifically, after passing through the optical elements LS7 through LS3, the exposure light beam EL passes through a predetermined area of the upper surface T4 of the second optical element LS2, passes through a predetermined area of the lower surface T3, and is then made incident on the second liquid immersion area LR2. The exposure light beam EL that has passed through the second liquid immersion area LR2 passes through a predetermined area of the upper surface T2 of the first optical element LS1, and then passes through a predetermined area of the lower surface T1 and is made incident on the first liquid immersion area LR1 and arrives at the surface of the substrate P.

In this embodiment, the first optical element LS1 is a plane-parallel that is capable of transmitting the exposure light beam EL and has no refractive power, and the lower surface T1 and the upper surface T2 of the first optical element LS1 are approximately parallel to each other. On the other hand, the second optical element LS2 has a refractive power (lens function). It is allowed that the first optical element LS1 has a refractive power (lens function).

The substrate stage PST1 has a substrate holder PH which holds the substrate P, and provided movably on the base PB on the side of the image plane of the projection optical system PL. The substrate stage PST is driven by the substrate stage driving mechanism PSTD1. The substrate stage driving mechanism PSTD1 is controlled by the control unit CONT. The substrate stage driving mechanism PSTD1 includes, for example, a linear motor or a voice coil motor, and can move the substrate stage PST1 in the X axis, Y axis, and Z axis directions and the θX, θY, and θZ directions, respectively. Therefore, the substrate stage PST1 can move the substrate P held on the substrate holder PH in the X axis, Y axis, and Z axis directions and the θX, θY, and θZ directions, respectively.

On a side surface of the substrate stage PST1, a movement mirror 54 is provided. At a position opposite or opposed to the movement mirror 54, a laser interferometer 55 is provided. The position in the two-dimensional direction and the angle of rotation of the substrate P on the substrate stage PST1 are measured in real time by the laser interferometer 55, and the result of measurement is outputted to the control unit CONT. The control unit CONT operates to position the substrate P supported on the substrate stage PST1 in the X axis direction and the Y axis direction by driving the substrate stage PST1 via the substrate stage driving mechanism PSTD1 in the two-dimensional coordinate system defined by the laser interferometer 55 on the basis of the result of the measurement of the laser interferometer 55.

The exposure apparatus EX includes an oblique incidence type focus detection system which detects surface position infounation of the surface of the substrate P, for example, as disclosed in Japanese Patent Application Laid-open No. 8-37149. The focus detection system detects a position (focus position) in the Z axis direction of the surface of the substrate P with respect to the image plane of the projection optical system PL. The focus detection system is also capable of obtaining a posture in an inclination direction of the substrate P by obtaining focus positions at a plurality of points on the surface of the substrate P. The control unit CONT operates to drive the substrate stage PST1 via the substrate stage driving mechanism PSTD1 based on the result of detection of the focus detection system and controls the position in the Z axis direction (focus position) and the positions in the θX and BY directions of the substrate P so that the surface (exposure surface) of the substrate P matches the image plane formed via the projection optical system PL and the liquid LQ.

The focus detection system may be a unit which detects surface position of the substrate P outside the liquid immersion area LR1 not through the liquid LQ1, or may be a combination of this unit and a unit which detects the surface position of the substrate P through the liquid LQ1. As disclosed in Published Japanese Translation of PCT International Publication for Patent Application No. 2000-505958 (corresponding to U.S. Pat. No. 5,969,441), or U.S. Pat. No. 6,208,407, the positional information of the surface of the substrate P may be measured from a position away from the projection optical system PL.

A recess 50 is provided on the surface of the substrate stage PST1, and the substrate holder PH is arranged in the recess 50. The upper surface 51 except for the recess 50 of the substrate stage PST1 is a flat surface at approximately the same height (flush) as that of the substrate P held on the substrate holder PH. The upper surface 51 of the substrate stage PST1 is lyophobic or liquid-repellent with respect to the first liquid LQ1. Since the upper surface 51 approximately flush with the surface of the substrate P is provided around the substrate P, when the liquid immersion exposure is performed for the circumferential edge of the surface of the substrate P, the first liquid immersion area LR1 can be satisfactorily formed while retaining the first liquid LQ1 on the side of the image plane of the projection optical system PL. It is allowable that the surface of the substrate P held on the substrate holder PH and the upper surface 51 have a difference in level as long as the first liquid immersion area LR1 can be satisfactorily maintained.

The measuring stage PST2 is provided with various measuring instruments which make measurements relating to an exposure process, and is provided movably on the base BP on the side of the image plane of the projection optical system PL. The measuring stage PST2 is driven by the measuring stage driving mechanism PSTD2. The measuring stage driving mechanism PSTD2 is controlled by the control unit CONT. The control unit CONT can operates to move the substrate stage PST1 and the measuring stage PST2 independently from each other on the base BP via the stage driving mechanisms PSTD1 and PSTD2, respectively. The measuring stage driving mechanism PSTD2 has a construction equivalent to that of the substrate stage driving mechanism PSTD1, and the measuring stage PST2 can be moved in the X axis, Y axis, and Z axis directions and the θX, θY, and θZ directions similarly to the substrate stage PST1, by the measuring stage driving mechanism PSTD2. On a side surface of the measuring stage PST2, a movement mirror 56 for the laser interferometer 57 is provided. The position in the two-dimensional direction and the angle of rotation of the measuring stage PST2 are measured in real time by the laser interferometer 57, and the control unit CONT controls the position of the measuring stage PST2 based on the result of measurement of the laser interferometer 57.

On the measuring stage PST2 arranged on the side of the image plane of the projection optical system PL, an opening 64K is formed, and in this opening 64K, a transparent member 64 is arranged. The transparent member 64 is formed of, for example, a glass plate. As the material of the transparent member 64, calcium fluoride, silica glass or the like can be selected according to the wavelength of light to be guided to the image pickup device which will be described later on. The upper surface 65 of the transparent member 64 is a flat surface. The upper surface 58 except for the opening 64K of the measuring stage PST2 is also a flat surface. The upper surface 58 of the measuring stage PST2 and the upper surface 65 of the transparent member 64 arranged in the opening 64K are provided at the same height (so as to be flush), and the upper surface 58 of the measuring stage PST2 is formed so as to include the upper surface 65 of the transparent member 64. It is desirable that the upper surface 58 of the measuring stage PST2 and the upper surface 65 of the transparent member 64 are liquid-repellent with respect to the liquid LQ.

The upper surface 58 of the measuring stage PST2 including the upper surface 65 of the transparent member 64 is positioned side by side with the upper surface 51 of the substrate stage PST1 including the surface of the substrate P, and the upper surface 51 of the substrate stage PST1 and the upper surface 58 of the measuring stage PST2 are provided at approximately the same height.

In the measuring stage PST2, an internal space 66 connected to the opening 64 is formed. In the internal space 66 of the measuring stage PST2, an observation unit 60 is arranged. The observation unit 60 includes an optical system 61 arranged below the transparent member 64 and an image pickup device 63 constructed of a CCD, etc. The image pickup device 63 can obtain or acquire an optical image (image) of the liquids (LQ1, LQ2) and the optical elements (LS1, LS2) via the transparent member 64 and the optical system 61. The image pickup device 63 converts an obtained image into an electrical signal and outputs the signal (image data) to the control unit CONT. Also, the observation unit 60 has an adjusting mechanism 62 which can adjust the focal position of the optical system 61. Also, the observation unit 60 has a field of view which enables observation of the entirety of the first liquid immersion area LR1 and the second liquid immersion area LR2. For the image pickup device 63, for example, a charge coupled device (CCD) can be used. However, the image pickup device 63 is not limited to the CCD, and various elements can be used. As the charge coupled device, an element with high sensitivity for (wavelength of) light made incident thereon can also be appropriately selected.

Although the entirety of the observation unit 60 may be arranged inside the measuring stage PST2, the following arrangement, for example, may be adopted in which a part of the optical elements constructing the optical system 61 and the image pickup device 63 and the like are arranged outside the measuring stage PST2. Further, the adjusting mechanism 62 may be omitted.

Alternatively, it is also allowable that the image pickup device 63 is omitted and the optical signal is directly guided to the control unit CONT through an optical fiber or waveguide and the optical signal is processed or photoelectrically converted as it is in the control unit. Still alternatively, it is also allowable that the optical signal is directly guided to the display unit DY and the states of the first liquid immersion area LR1 and the second liquid immersion area LR2 are observed on the display unit DY.

Figure 2:
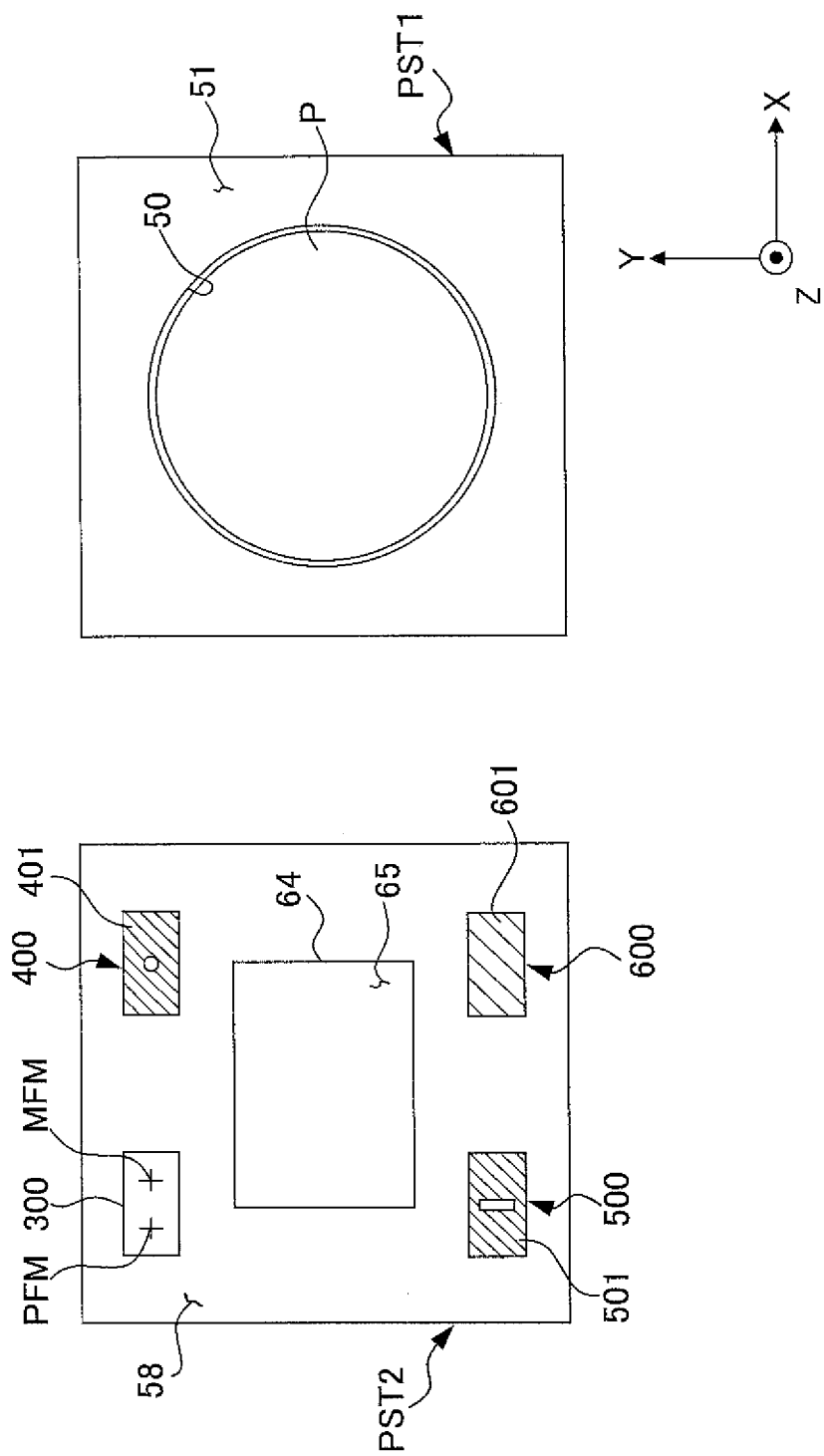
FIG. 2 is a plan view of a substrate stage and a measuring stage viewed from above.

FIG. 2 is a plan view of the substrate stage PST1 and the measuring stage PST2 viewed from above. In FIG. 2, on the upper surface 58 of the measuring stage PST2, in order to define the alignment position of the substrate P with respect to the image of the pattern of the mask M via the projection optical system PL, a reference member 300 for measuring the positional relationship (baseline amount) in the XY plane of the projecting position of the image of the pattern and a detection reference of a substrate alignment system that is not shown is provided as a measuring instrument. The reference member 300 is formed with a reference mark PFM and a reference mark MFM in a predetermined positional relationship. The reference mark PFM is detected by a FIA (field image alignment) type substrate alignment system as disclosed in, for example, Japanese Patent Application Laid-open No. 4-65603 (corresponding to U.S. Pat. No. 5,493,403), not via the projection optical system PL and the liquids LQ1 and LQ2. The reference mark MFM is detected by a VRS (visual reticle alignment) type mask alignment system as disclosed in Japanese Patent Application Laid-open No. 7-176468 via the projection optical system PL and the liquids LQ1 and LQ2. On the upper surface 58, as measuring instruments, an upper plate 401 constructing a part of an unevenness sensor 400 for measuring illuminance unevenness as disclosed in Japanese Patent Application Laid-open No. 57-117238 and measuring a variation of the transmittance of the exposure light beam EL via the projection optical system PL as disclosed in Japanese Patent Application Laid-open No. 2001-267239, an upper plate 501 constructing a part of a spatial image measuring sensor 500 as disclosed in Japanese Patent Application Laid-open No. 2002-14005, and an upper plate 601 constructing a part of an irradiance sensor (illuminance sensor) 600 as disclosed in Japanese Patent Application Laid-open No. 11-16816, are provided. The upper surface of the reference member 300 and the upper surfaces of these upper plates 401, 501 and 601 are approximately flush with the upper surface 58 of the measuring stage PST2 and the upper surface 65 of the transparent member 64. The upper surface of the reference member 300 and the upper surfaces of the upper plates 401, 501, and 601 are also liquid-repellent similarly to the upper surface 58 of the measuring stage PST2 and the upper surface 65 of the transparent member 64.

In this embodiment, the measuring stage PST2 is a stage dedicated to performing a measuring process concerning an exposure process and does not hold the substrate P, and the substrate stage PST1 is not provided with a measuring instrument for performing measurement concerning the exposure process. The measuring stage PST2 is disclosed in greater detail in, for example, Japanese Patent Application Laid-open No. 11-135400.

Figure 3:
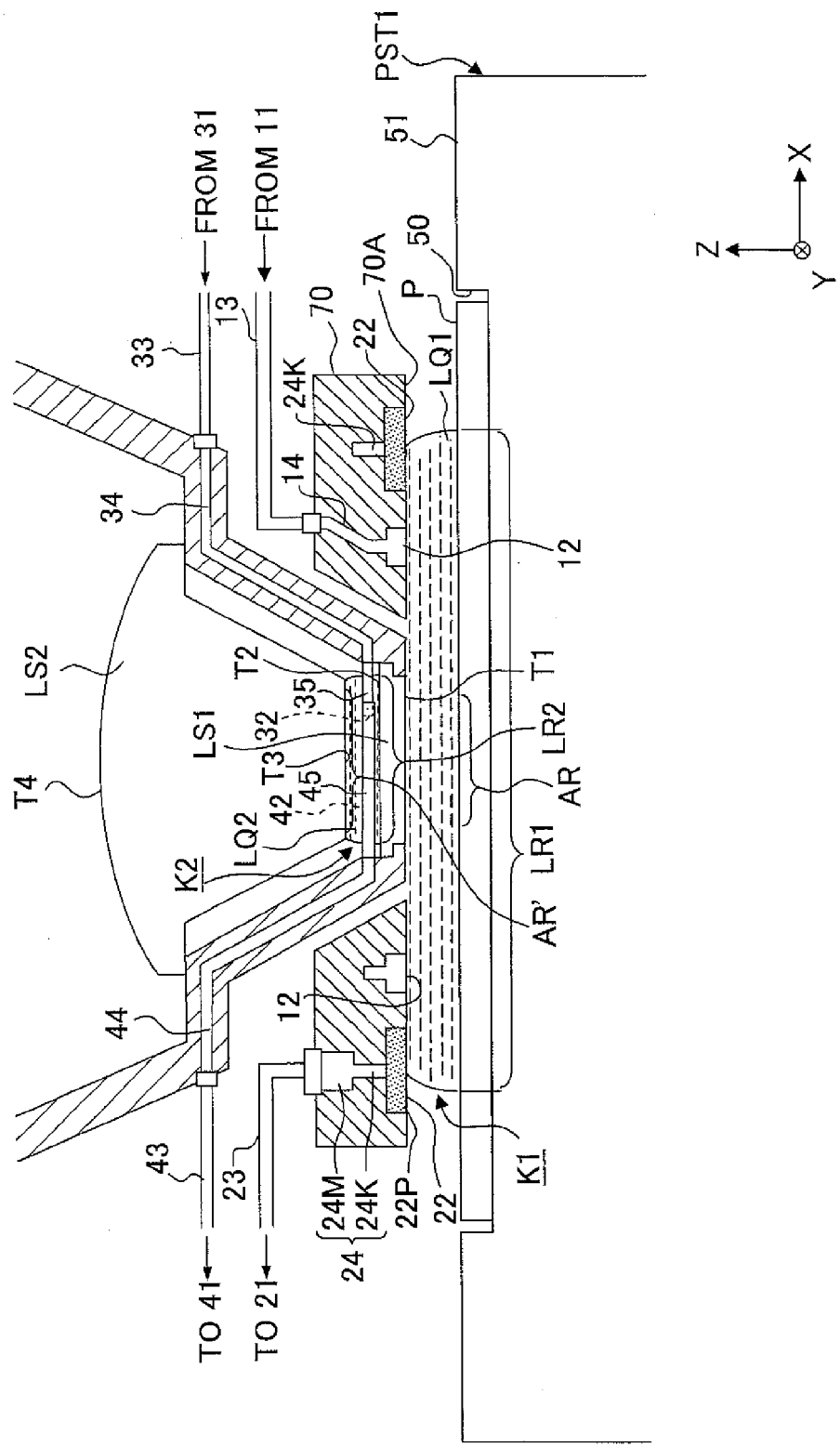
FIG. 3 is an enlarged sectional view in the vicinity of an end portion of a projection optical system.

Next, the first liquid immersion mechanism 1 and the second liquid immersion mechanism 2 will be explained with reference to FIG. 1 and FIG. 3. FIG. 3 is an enlarged sectional view illustrating the vicinity of the end portion on the side of the image plane of the projection optical system PL.

The first liquid supply mechanism 10 of the first liquid immersion mechanism 1 supplies the first liquid LQ1 to a first space K1 on the side of the image plane of the first optical element LS1 of the projection optical system PL. The first liquid supply mechanism 10 includes a first liquid supply unit 11 capable of feeding the first liquid LQ1 and a first supply tube 13 whose one end is connected to the first liquid supply unit 11. The other end of the first supply tube 13 is connected to a nozzle member 70. In this embodiment, the first liquid supply mechanism 10 supplies pure water. The first liquid supply unit 11 includes a water purifying apparatus, a temperature adjusting apparatus which adjusts the temperature of the first liquid (pure water) LQ1 which is to be supplied, and a degassing unit for reducing gas components in the first liquid LQ1 to be supplied. A water purifying apparatus (power usage) installed in a factory in which the exposure apparatus EX is installed can be used, instead of providing the water purifying apparatus in the exposure apparatus EX provided that a predetermined quality condition is satisfied. Similarly, it is not necessarily indispensable that the exposure apparatus EX includes the temperature adjusting apparatus and the degassing unit, etc., and instead of at least a part of these apparatuses, the facilities in the factory in which the exposure apparatus EX is installed can also be used.

A flow controller 16, called mass flow controller, which controls the liquid amount per unit time to be fed from the first liquid supply unit 11 and supplied to the side of the image plane of the projection optical system PL is provided in an intermediate position of the first supply tube 13. The liquid supply amount by the flow controller 16 is controlled in response to an instruction signal from the control unit CONT.

The first liquid recovery mechanism 20 of the first liquid immersion mechanism 1 recovers the first liquid LQ1 on the side of the image plane of the projection optical system PL. The first liquid recovery mechanism 20 includes a first liquid recovery unit 21 capable of recovering the first liquid LQ1 and a first recovery tube 23 of which one end is connected to the first liquid recovery unit 21. The other end of the first recovery tube 23 is connected to the nozzle member 70. The first liquid recovery unit 21 includes a vacuum system (suction unit) such as a vacuum pump, a gas-liquid separator which separates the recovered first liquid LQ1 from a gas, a tank for accommodating the recovered liquid LQ, and the like. It is also possible that at least a part of the vacuum system, the gas-liquid separator, and the tank is not provided in the exposure apparatus EX, and instead the facilities of the factory in which the exposure apparatus EX is installed are used.

The nozzle member 70 which is an annular member is arranged in the vicinity of the side of the image plane of the projection optical system PL. A gap is formed between the nozzle member 70 and the barrel PK of the projection optical system PL, and the nozzle member 70 is supported by a predetermined supporting mechanism so as to be isolated from the projection optical system PL in terms of vibration. The lower surface 70A of the nozzle member 70 faces or opposes to the surface of the substrate P (upper surface 51 of the substrate stage PST1).

In the lower surface 70A of the nozzle member 70, a first supply port 12 for supplying the first liquid LQ1 onto the substrate P is provided. The first supply port 12 is provided as a plurality of first supply ports 12 in the lower surface 70A of the nozzle member 70. Inside the nozzle member 70, an internal flow passage 14 which connects the other end of the first supply tube 13 and the first supply ports 12 is formed. One end of the internal flow passage 14 is connected to the other end of the first supply tube 13, and the other end of the internal flow passage 14 is branched at an intermediate portion thereof so as to be connected to the first supply ports 12, respectively.

Furthermore, on the lower surface 70A of the nozzle member 70, a first recovery port 22 for recovering the first liquid LQ1 from the surface of the substrate P is provided. In this embodiment, on the lower surface 70A of the nozzle member 70, the first recovery port 22 is provided annularly outside of the first supply ports 12 with respect to the optical axis AX of the projection optical system PL so as to surround the first supply ports 12. Inside the nozzle member 70, an internal flow passage 24 connecting the other end of the first recovery tube 23 and the first recovery port 22 is formed. The internal flow passage 24 includes an annular flow passage 24K formed according to the annular first recovery port 22 and a manifold flow passage 24M connecting a portion of the annular flow passage 24K and the other end of the first recovery tube 23. In this embodiment, the first recovery port 22 is provided with a porous member 22P. The construction (the positions of the supply ports and the position of the recovery port, etc.) of the nozzle member 70 is not limited to those described above, and nozzle members with various constructions can be used, and an example thereof is disclosed in United States Patent Publication No. 2004/0165159.

Operations of the first liquid supply unit 11 and the first liquid recovery unit 21 are controlled by the control unit CONT. When forming the first liquid immersion area LR1 of the first liquid LQ1 in the first space K1, the control unit CONT operates to feed the first liquid LQ1 from the first liquid supply unit 11, and supplies the first liquid LQ1 onto the substrate P from the first supply ports 12 provided above or over the substrate P via the first supply tube 13 and the internal flow passage 14 of the nozzle member 70. The first liquid LQ1 in the first space K1 is recovered from the first recovery port 22 to the first liquid recovery unit 21 via the internal flow passage 24 of the nozzle member 70 and the first recovery tube 23.

In this embodiment, the exposure apparatus EX adopts a local liquid immersion method in which the first liquid immersion area LR1 larger than the projection area AR and smaller than the substrate P is locally faulted on a part of the surface of the substrate P including the projection area AR of the projection optical system PL. Here, the lower surface 70A of the nozzle member 70 and the lower surface T1 of the first optical element LS1 are approximately flat surfaces, and the lower surface 70A of the nozzle member 70 and the lower surface T1 of the first optical element LS1 are approximately flush with each other. Accordingly, the first liquid immersion area LR1 can be satisfactorily formed in a predetermined range. The lower surface T1 of the first optical element LS1 which makes contact with the first liquid LQ1 in the first liquid immersion area LR1 and the lower surface 70A, of the nozzle member 70, which makes contact with the first liquid LQ1 in the first liquid immersion area LR1 have lyophilic or liquid-attracting property with respect to the first liquid LQ1.

The second liquid supply mechanism 30 of the second liquid immersion mechanism 2 supplies the second liquid LQ2 to a second space K2 between the second optical element LS2 and the first optical element LS1 of the projection optical system PL. The second liquid supply mechanism 30 includes a second liquid supply unit 31 capable of feeding the second liquid LQ2 and a second supply tube 33 of which one end is connected to the second liquid supply unit 31. The second liquid supply unit 31 has a construction approximately equivalent to that of the first liquid supply unit 11. Namely, the second liquid supply unit 31 includes a temperature adjusting apparatus which adjusts the temperature of the second liquid (pure water) LQ2 to be supplied and a degassing unit for reducing gas components in the second liquid LQ2 to be supplied. The other end of the second supply tube 33 is connected to one end of the supply flow passage 34 formed inside the barrel PK. The other end of the supply flow passage 34 is connected to a supply member 35 arranged inside (internal space of) the barrel PK. In the supply member 35, an internal flow passage in which the second liquid LQ2 flows is formed, and at a predetermined position of the supply member 35, a second supply port 32 which is connected to the internal flow passage and is for supplying the second liquid LQ2 to the second space K2 are formed. Namely, to the second space K2, the second liquid LQ2 which has been adjusted in temperature and degassed is supplied from the second supply port 32. Instead of providing all of the water purifying apparatus, the temperature adjusting apparatus, and the degassing unit in the exposure apparatus EX, it is also possible that the facilities in the factory in which the exposure apparatus EX is installed can be used in place of at least a part of these apparatuses.

At an intermediate position of the second supply tube 33, a flow controller (mass flow controller) 36 which controls a liquid amount per unit time to be fed from the second liquid supply unit 31 and to be supplied to the second space K2 is provided. The control of the liquid supply amount by the flow controller 36 is performed in response to an instruction signal from the control unit CONT.

The second liquid recovery mechanism 40 of the second liquid immersion mechanism 2 recovers the second liquid LQ2 from the second space K2 between the second optical element LS2 and the first optical element LS1 of the projection optical system PL. The second liquid recovery mechanism 40 includes a second liquid recovery unit 41 capable of recovering the second liquid LQ2 and a second recovery tube 43 of which one end is connected to the second liquid recovery unit 41. The second liquid recovery unit 41 has a construction approximately equivalent to that of the first liquid recovery unit 21. The other end of the second recovery tube 43 is connected to one end of a recovery flow passage 44 formed inside the barrel PK. The other end of the recovery flow passage 44 is connected to the recovery member 45 arranged inside (internal space) the barrel PK. In the recovery member 45, an internal flow passage in which the second liquid LQ2 flows is formed, and at a predetermined position of the recovery member 45, a second recovery port 42 connected to the internal flow passage and for recovering the second liquid LQ2 from the second space K2 is provided. In this embodiment, the recovery member 45 is an annular member surrounding the second liquid immersion area LR2, and the second recovery port 42 is provided as a plurality of second recovery ports 42 in a surface of the recovery member 45 facing the second liquid immersion area LR2. The construction of the second liquid immersion mechanism 2 is not limited to that described above, and various constructions can be adopted provided that the optical path between the first optical element LS1 and the second optical element LS2 can be filled with the second liquid LQ2.

Operations of the second liquid supply unit 31 and the second liquid recovery unit 41 are controlled by the control unit CONT. When forming the second liquid immersion area LR2 of the second liquid LQ2 in the second space K2, the control unit CONT operate to feed the second liquid LQ2 from the second liquid supply unit 31, and supplies the second liquid LQ2 to the second space K2 from the second supply ports 32 via the second supply tube 33, the supply flow passage 34, and the internal flow passage of the supply member 35. The second liquid LQ2 in the second space K2 is recovered from the second recovery port 42 to the second liquid recovery unit 41 via the internal flow passage of the recovery member 45, the recovery flow passage 44, and the second recovery tube 43.

As the degassing units of the first liquid supply unit 11 and the second liquid supply unit 31, for example, a degassing unit disclosed in International Publication No. 2004/053950 can be applied, and its structure will be described in detail later in connection with FIG. 12.

In this embodiment, the exposure apparatus EX locally forms a second liquid immersion area AR' only in a partial area including an area AR' through which the exposure light beam EL passes in the upper surface T2 of the first optical element LS1.

In this embodiment, the first space K1 on the side of the lower surface T1 of the first optical element LS1 and the second space K2 between the first optical element LS1 and the second optical element LS2 are spaces independent from each other. The control unit CONT can perform operations for supplying and recovering the first liquid LQ1 to and from the first space K1 by the first liquid immersion mechanism 1 and operations for supplying and recovering the second liquid LQ2 to and from the second space K2 by the second liquid immersion mechanism 2 independently from each other, and the liquids (LQ1 and LQ2) do not flow from one of the first space K1 and the second space K2 to the other.

By filling the optical path spaces of the first space K1 on the side of the lower surface T1 of the first optical element LS1 and the second space K2 on the side of the upper surface T2 with the first liquid LQ1 and the second liquid LQ2, respectively, the reflection losses on the lower surface T3 of the second optical element LS2 and the upper surface T2 of the first optical element LS1 are reduced, and the substrate P can be satisfactorily exposed while securing a large image side numerical aperture.

In this embodiment, since the first optical element LS1 is easily attachable to and detachable (exchangeable) from the barrel PK, when the first optical element LS1 is polluted, by exchanging the polluted first optical element LS1 with a clean first optical element LS1, deterioration of the exposure accuracy and the measuring accuracy via the projection optical system PL due to the pollution or contamination of the optical element can be prevented.

Figure 4:
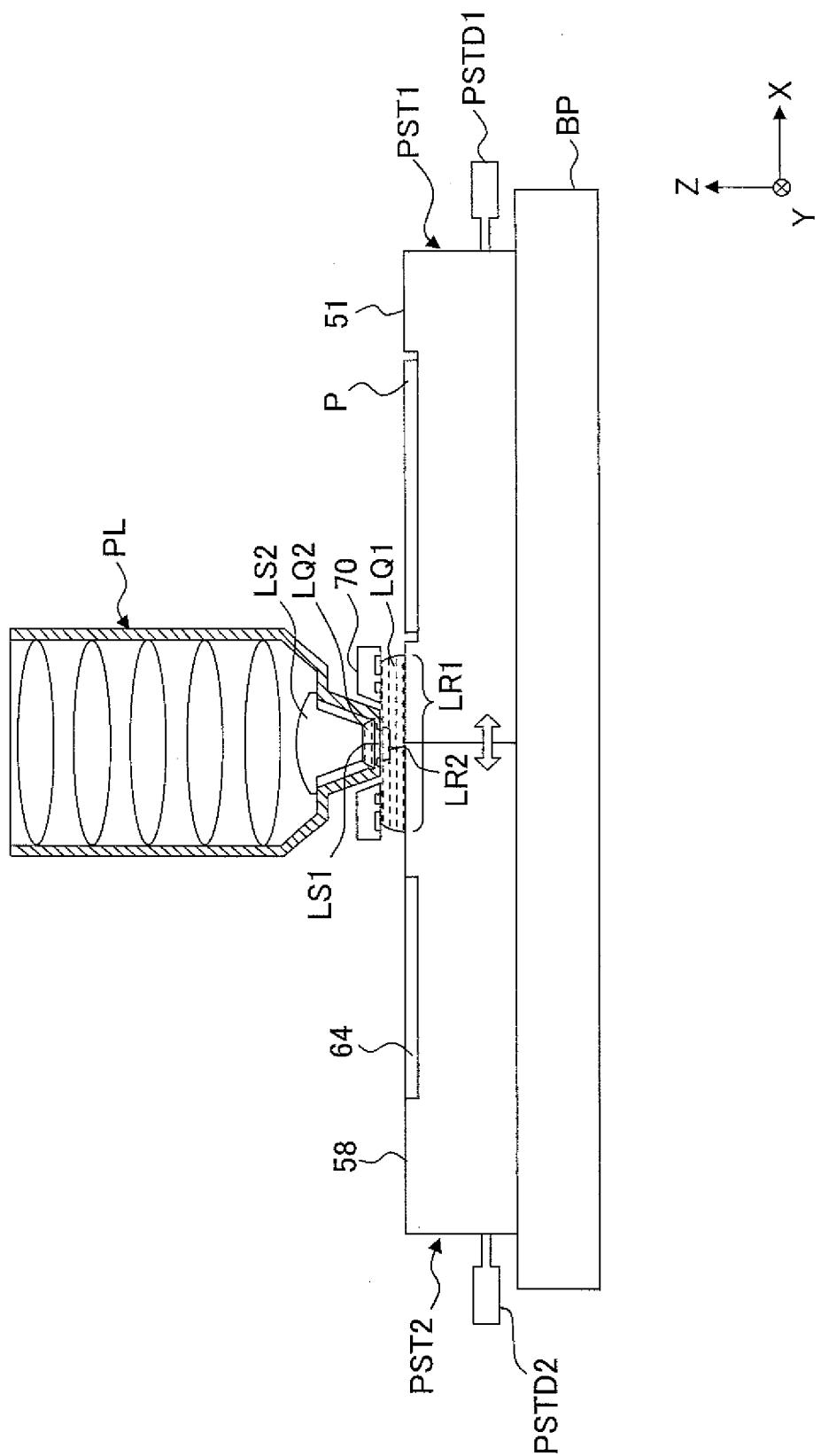
FIG. 4 is a drawing for explaining a moving state of a first liquid immersion area between the substrate stage and the measuring stage.

As shown in FIG. 4, the first liquid immersion area LR1 formed below or under the first optical element LS1 of the projection optical system PL is movable between the upper surface of the substrate stage PST1 and the upper surface of the measuring stage PST2. When the first liquid immersion area LR1 is moved, the control unit CONT operate to move the substrate stage PST1 and the measuring stage PST2 together in the XY direction while bringing the substrate stage PST1 and the measuring stage PST2 into contact with each other or close to each other, and moves the first liquid immersion area LR1 between the upper surface of the substrate stage PST1 and the upper surface of the measuring stage PST2 by using the stage driving mechanisms PSTD1 and PSTD2. Accordingly, the first liquid immersion area LR1 can be moved between the upper surface of the substrate stage PST1 and the upper surface of the measuring stage PST2 in a state in that the first space K1 (optical path space) on the side of the image plane of the projection optical system PL is filled with the first liquid LQ1 while the outflow of the first liquid LQ1 from a gap between the substrate stage PST1 and the measuring stage PST2 is suppressed.

Therefore, when the substrate stage PST1 moves from the position below or under the projection optical system PL for, for example, exchange of the substrate P, the first liquid immersion area LR1 moves from the upper surface of the substrate stage PST1 to the upper surface of the measuring stage PST2, and an operation is executed by using at least one of the observation unit 60, the reference member 300, the unevenness sensor 400, the spatial image measuring sensor 500, and the irradiance sensor 600 through the first liquid LQ1 while retaining the first liquid LQ1 between (in a space between) the first optical element LS1 of the projection optical system PL and the upper surface of the measuring stage PST2. In this case, the result of this operation is reflected to the subsequent exposure operation, etc. When the substrate stage PST1 moves to the position below or under the projection optical system PL, the first liquid immersion area LR1 moves from the upper surface of the measuring stage PST2 to the upper surface of the substrate stage PST1, and the exposure operation or the like is performed or executed for the substrate P, while retaining the first liquid LQ1 between (in a space between) the first optical element LS1 of the projection optical system PL and the upper surface (including the surface of the substrate P) of the substrate stage PST1.

Next, procedures for exposing the substrate P by using the exposure apparatus EX constructed as described above will be described with reference to the flowchart of FIG. 5 and FIG. 6.

First, the control unit CONT operates to drive the first liquid immersion mechanism 1 and the second liquid immersion mechanism 2, respectively, while making the projection optical system PL and the transparent member 64 on the measuring stage PST2 face or to be opposite to each other so as to form the first liquid immersion area LR1 and the second liquid immersion area LR2, respectively (step SA1). Accordingly, as shown in FIG. 6, the first liquid immersion area LR1 is formed on the upper surface 58 of the measuring stage PST2 including the upper surface 65 of the transparent member 64.

The control unit CONT operates to observe the state of the first liquid immersion area LR1 formed on the transparent member 64 by using the observation unit 60 (step SA2). The observation unit 60 observes the state of the first liquid immersion area LR1 on the upper surface 65 of the transparent member 64 via the transparent member 64. When the observation unit 60 observes the state of the first liquid immersion area LR1, the measuring stage PST2 nearly stands still. In the internal space 66 below or under the transparent member 64, the optical system 61 of the observation unit 60 is arranged, and the image pickup device 63 obtains an image of the first liquid LQ1 forming the first liquid immersion area LR1 on the transparent member 64 via the transparent member 64 and the optical system 61. When observing the state of the first liquid immersion area LR1 by using the observation unit 60, the control unit CONT operates to align the focal position of the optical system 61 with a position in the Z axis direction of the first liquid immersion area LR1 by using the adjusting mechanism 62. Therefore, the image pickup device 63 can satisfactorily obtain the image of the first liquid LQ1 forming the first liquid immersion area LR1 on the transparent member 64. Since the observation unit 60 has a field of view larger than the first liquid immersion area LR1, the observation unit 60 can obtain the image of the first liquid LQ1 forming the first liquid immersion area LR1 at a time.

There is a possibility that the size of the first liquid immersion area LR1 changes depending on the liquid supply amount and the liquid recovery amount by the first liquid immersion mechanism 1. However, the observation unit 60 has a field of view which enables observation of the largest possible first liquid immersion area LR1.

Image data concerning the first liquid immersion area LR1 obtained by the image pickup device 63 is outputted to the control unit CONT (step SA3). The control unit CONT operates to display the image of the first liquid LQ forming the first liquid immersion area LR1 by the display unit DY based on the signal (image data) outputted from the image pickup device 63.

Next, the control unit CONT operates to observe the state of the second liquid immersion area LR2 by using the observation unit 60 (step SA4). The observation unit 60 observes the second liquid immersion area LR2 via the first liquid LQ1 in the first liquid immersion area LR1 and the first optical element LS1. Also during observation of the state of the second liquid immersion area LR2 by the observation unit 60, the measuring stage PST2 substantially stands still. When observing the state of the second liquid immersion area LR2 by using the observation unit 60, the control unit CONT operates to align the focal position of the optical system 61 with the position in the Z axis direction of the second liquid immersion area LR2 by using the adjusting mechanism 62. Therefore, the image pickup device 63 can satisfactorily obtain the image of the second liquid LQ2 forming the second liquid immersion area LR2. The observation unit 60 has a field of view larger than the second liquid immersion area LR2, so that it can obtain the image of the second liquid LQ2 forming the second liquid immersion area LR2 at a time.

The image data concerning the second liquid immersion area LR2 obtained by the image pickup device 63 is outputted to the control unit CONT (step SA5). The control unit CONT operates to display the image of the second liquid LQ2 forming the second liquid immersion area LR2 by the display unit DY based on the signal (image data) outputted from the image pickup device 63.

In this case, the state of the second liquid immersion area LR2 is observed after the state of the first liquid immersion area LR1 is observed. However, it is also possible that the state of the first liquid immersion region LR1 is observed after the state of the second liquid immersion area LR2 is observed.

The control unit CONT performs arithmetic processing (image processing) for the signals outputted from the image pickup device 63 in step SA3 and step SA5, respectively, and judges whether or not the first and second liquid immersion areas LR1 and LR2 are in desired states, based on the results of processing (step SA6). The control unit CONT especially judges whether particles and/or a gas portion or portions (air mass and bubbles) are present in the liquids (LQ1 and LQ2). For example, the control unit CONT judges whether each pixel of the output from the image pickup deice 63 is bright or dark, and regards or considers an isolated pixel or pixel group as the presence of bubbles in the liquid and obtains the number and amount of bubbles from the number of such isolated pixels or pixel groups. Alternatively, the control unit CONT may store in advance image data of a plurality of liquid, samples of which number and/or amount of bubbles are known, in the memory of the control unit CONT, and may judge the number and amount of bubbles by comparison with the data. In this case, the image data may be made correspondent to an average area and an average number of the bright sections or dark sections of the pixels. The image data and reference data may be stored in the memory of the control unit, or may be stored in a memory separately provided in the exposure apparatus. In the same manner, the positions and sizes of voids in the liquid can also be detected.

For example, immediately after the first liquid immersion mechanism 1 starts the operation for forming the first liquid immersion area LR1 (immediately after starting supply of the first liquid LQ1), there is a high possibility that an inconvenience or problem occurs such that the first liquid immersion area LR1 is not sufficiently covering the projection area AR (shortage or running out of liquid) or bubbles enter and mix in the first liquid LQ1. There is a possibility that the state of the first liquid immersion area LR1 varies and causes the above-described inconvenience not only immediately after starting the operation for forming the first liquid immersion area LR1 but also depending on the operating state of the first liquid immersion mechanism 1. When an exposure process or a measuring process is performed via the first liquid immersion area LR1 in a state that such inconvenience occurs, it becomes impossible to obtain satisfactory exposure accuracy and measuring accuracy. In this embodiment, by observing the state of the first liquid immersion area LR1 by using the observation unit 60, it is possible to grasp whether or not an inconvenience has occurred in the first liquid immersion area LR1. Similarly, also in the second liquid immersion area LR2, an inconvenience such as shortage of liquid and/or entrance and mixture of bubbles may occur, and it is possible to grasp whether or not the inconvenience has occurred in the second liquid immersion area LR2 by observing the state of the second liquid immersion area LR2 by using the observation unit 60. In this embodiment, the observation unit 60 can observe (detect) bubbles with diameters of, for example, not less than 0.1 mm. However, the observation (detection) performance of the observation unit 60 is determined according to the line width or the like of the pattern to be formed on the substrate P by the exposure apparatus EX, and the observation unit may be configured to be able to observe bubbles having diameter of not less than 0.01 mm, for example.

When the first and second liquid immersion areas LR1 and LR2 are judged as being in desired states, the control unit CONT performs the measuring process by using the measuring instruments installed in the measuring stage PST2 (step SA7). Namely, the control unit CONT operates to move the measuring stage PST2 in the XY direction, and moves the first liquid immersion area LR1 from the upper surface of the transparent member 64 to the upper surface of any one of the reference member 300, the upper plate 401, the upper plate 501, and the upper plate 601. For example, when the first liquid immersion area LR1 is moved from the upper surface of the transparent member 64 to the upper surface of the upper plate 401 of the illuminance unevenness sensor 400, the control unit CONT operates to radiate the exposure light beam EL onto the upper plate 401 via the projection optical system PL, the first liquid LQ1 in the first liquid immersion area LR1, and the second liquid LQ2 in the second liquid immersion area LR2, and measures illuminance unevenness of the exposure light beam EL by using the illuminance unevenness sensor 400. Similarly, the control unit CONT operates to move the first liquid immersion area LR1 to the upper surface of the reference member 300, the upper surface of the upper plate 500, and the upper surface of the upper plate 600 in this order and performs a measuring process using each of the reference member 300, the spatial image measuring sensor 500, and the irradiance sensor 600. Then, based on the result of measurements using the respective measuring instruments, the control unit CONT performs a calibration process for the projection optical system PL as appropriate.

Concurrently with the various measuring operations of step SA7 or before and after the measuring operations, the reference mark PFM on the reference member 300 is detected by a substrate alignment system which is not shown, and a baseline amount is determined.

On the other hand, when it is judged that at least either one of the first liquid immersion area LR1 and the second liquid immersion area LR2 is not in the desired state, the control unit CONT sets a standby time until the above-described inconvenience (shortage of the liquid and/or entrance-mixture of bubbles) is solved or eliminated, or the control unit takes a measure for forming anew the liquid immersion area or areas after stopping the liquid supply to the spaces with the liquid immersion areas judged as not being in the desired state, recovering the liquids, and supplying the liquids again in order to eliminate the above-described inconvenience. Alternatively, to eliminate the inconvenience, a proper measure such as a change in the operating states of the first and second liquid immersion mechanisms 1 and 2 can be taken (step SA8). Here, the change in the operating states of the first and second liquid immersion mechanisms 1 and 2 include, for example, changes in liquid supply amounts per unit time by the first and second liquid supply mechanisms 10 and 30 of the first and second liquid immersion mechanisms 1 and 2, respectively, and adjustment of the degassing units provided in the first and second liquid supply mechanisms 10 and 30. Then, the states of the first and second liquid immersion areas LR1 and LR2 are observed again by using the observation unit 60 (steps SA2 and SA4), and after confirming that the inconvenience was eliminated, the measuring process (step SA7) is performed.

After completing the measuring process using the measuring stage PST2, as explained with reference to FIG. 4, the control unit CONT operates to move the first liquid immersion area LR1 of the first liquid LQ1 formed on the measuring stage PST2 to the upper surface of the substrate stage PST1 supporting the substrate P. Then, after moving the first liquid immersion area LR1 to the upper surface of the substrate stage PST1, the control unit CONT operates to radiate the exposure light beam EL onto the substrate P via the projection optical system PL, the second liquid LQ2 in the second liquid immersion area LR2, and the first liquid LQ1 in the first liquid immersion area LR1 to expose the substrate P (step SA9).

It is also possible that, for example, an operator judges whether the first and second liquid immersion areas LR1 and LR2 are in the desired states based on the images of the first and second liquid immersion areas LR1 and LR2 displayed on the display unit DY. In this case, the operator instructs the control unit CONT on a next operation.

As described above, since the observation unit 60 observes the states of the first and second liquid immersion areas LR1 and LR2, it is possible to confirm whether or not the first and second liquid immersion areas LR1 and LR2 are in the desired states based on the result of observation performed by the observation unit 60. Then, by exposing the substrate P after it is judged that the formed first and second liquid immersion areas LR1 and LR2 are in the desired states based on the result of observation performed by the observation unit 60, the substrate P can be satisfactorily exposed through the first and second liquids LQ1 and LQ2 in the first and second liquid immersion areas LR1 and LR2. On the other hand, when it is judged that the formed first and second liquid immersion areas LR1 and LR2 are not in the desired states such that gases (bubbles) enter and mix in the first and second liquid immersion areas LR1 and LR2, based on the result of observation performed by the observation unit 60, if an exposure process and a measuring process are performed via the first and second liquid immersion areas LR1 and LR2 in such states, any satisfactory exposure accuracy and measuring accuracy cannot be obtained. Therefore, the control unit CONT operates to take a proper measure for obtaining the desired states of the first and second liquid immersion areas LR1 and LR2, and by exposing the substrate P through the first and second liquids LQ1 and LQ2 in the first and second liquid immersion areas LR1 and LR2, respectively, after confirming that the states of the first and second liquid immersion areas LR1 and LR2 become desirable, the substrate P can be satisfactorily exposed.

The first liquid immersion area LR1 is formed between the projection optical system PL and the transparent member 64 arranged on the side of the image plane of the projection optical system PL, and the observation unit 60 observes the first liquid immersion area LR1 via the transparent member 64, so that the state of the first liquid immersion area LR1 can be satisfactorily observed.

Second Embodiment

Figure 7:
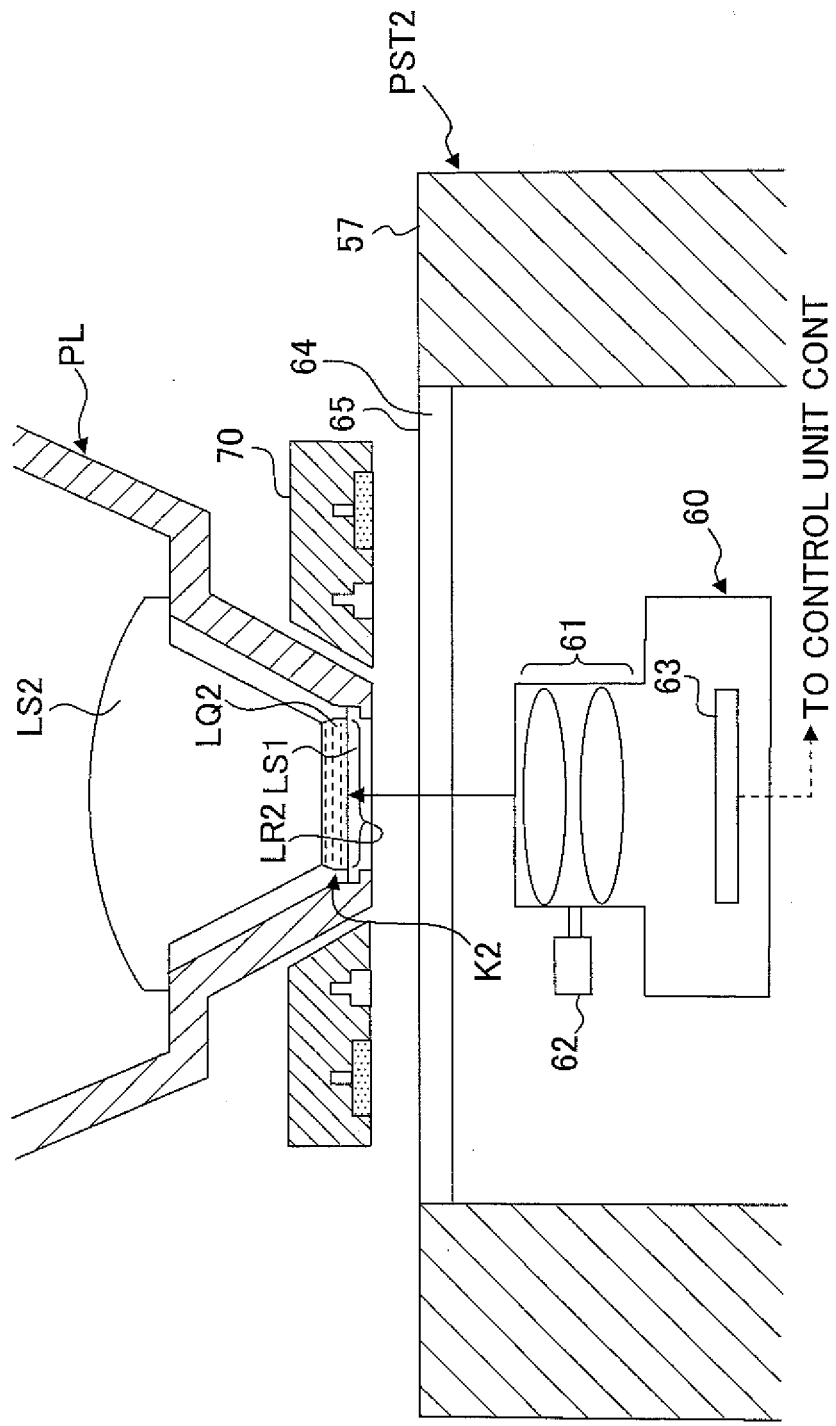
FIG. 7 is a drawing illustrating an exposure apparatus according to a second embodiment.

FIG. 7 is a drawing showing a second embodiment. In the following description, the constitutive parts or portions, which are same or equivalent to those of the first embodiment described above, are designated by the same reference numerals, and any explanation therefor will be simplified or omitted.

As shown in FIG. 7, when observing the second liquid immersion area LR2 by using the observation unit 60, the control unit CONT may operate to form only the second liquid immersion area LR2 by driving the second liquid immersion mechanism 2 without forming the first liquid immersion area LR1. Also in this case, the observation unit 60 can observe the second liquid immersion area LR2 in the second space K2 via the first optical element LS1.

The observation of the first liquid immersion area LR1 is executed before or after observation of the second liquid immersion area LR2 in a state that the second liquid immersion area LR2 is formed or the second liquid immersion area is not formed.

Third Embodiment

Figure 8:
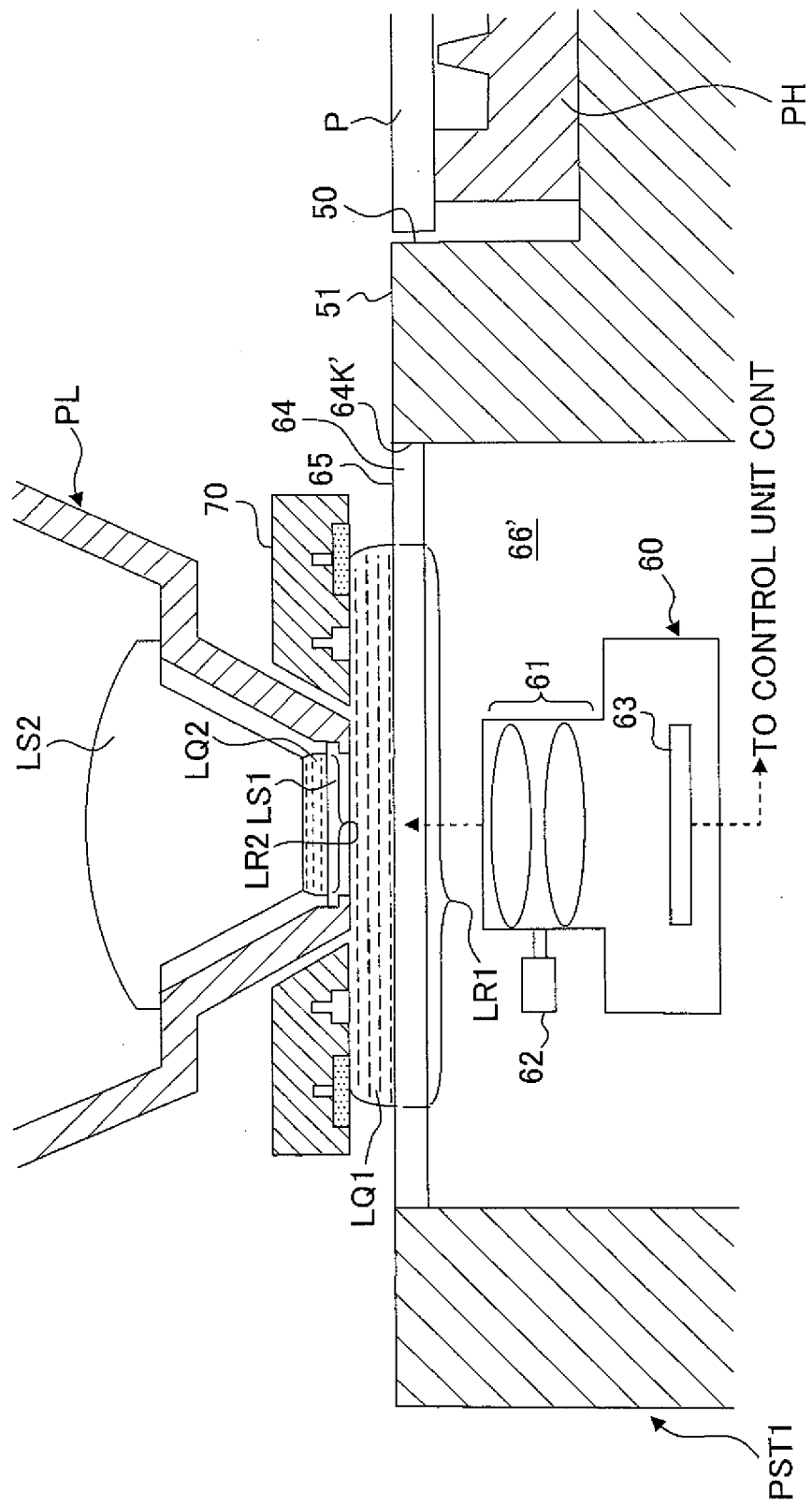
FIG. 8 is a drawing illustrating an exposure apparatus according to a third embodiment.

FIG. 8 is a drawing of a third embodiment. In FIG. 8, the observation unit 60 is provided in an internal space 66' of the substrate stage PST1. At a part of the upper surface 51 of the substrate stage PST1, an opening 64K' is formed so as to be connected to the internal space 66', and in this opening 64K', a transparent member 64 is arranged. The transparent member 64 and the observation unit 60 are allowed to be thus provided in the substrate stage PST1 which is movable while holding the substrate P.

In the above-described embodiments, the observation unit 60 has a field of view larger than the first and second liquid immersion areas LR1 and LR2. However, the observation unit 60 may have a field of view smaller than the first and second liquid immersion areas LR1 and LR2. In this case, by performing observation while moving the measuring stage PST2 (or substrate stage PST1), in which the observation unit 60 is provided, in the XY direction with respect to the projection optical system PL, that is, while relatively moving the first and second liquid immersion areas LR1 and LR2 and the field of view of the observation unit 60, the entirety of each of the respective first and second liquid immersion areas LR1 and LR2 can be satisfactorily observed.

It is also allowable that the observation unit 60 is provided with a zooming optical system so that observation is performed while changing the observation field of view between the time of observation of the liquid immersion area LR1 and the time of observation of the liquid immersion area LR2 or magnifying a part of the liquid immersion area.

In the embodiments described above, the control unit CONT operates to display the images of the first and second liquid immersion areas LR1 and LR2 on the display unit DY based on image data obtained by the image pickup device 63 of the observation unit 60. However, it is also allowable that the observation unit 60 has the image processing function and/or the display unit DY.

In the above-described embodiment, the control unit CONT executes the observation operation by using the observation unit 60 when the first and second liquid immersion mechanisms 1 and 2 forms the first and second liquid immersion areas LR1 and LR2, respectively. However, it is also allowable that the control unit CONT executes the observation operation at each predetermined time intervals or for each predetermined number of processed substrates.

Figure 9:
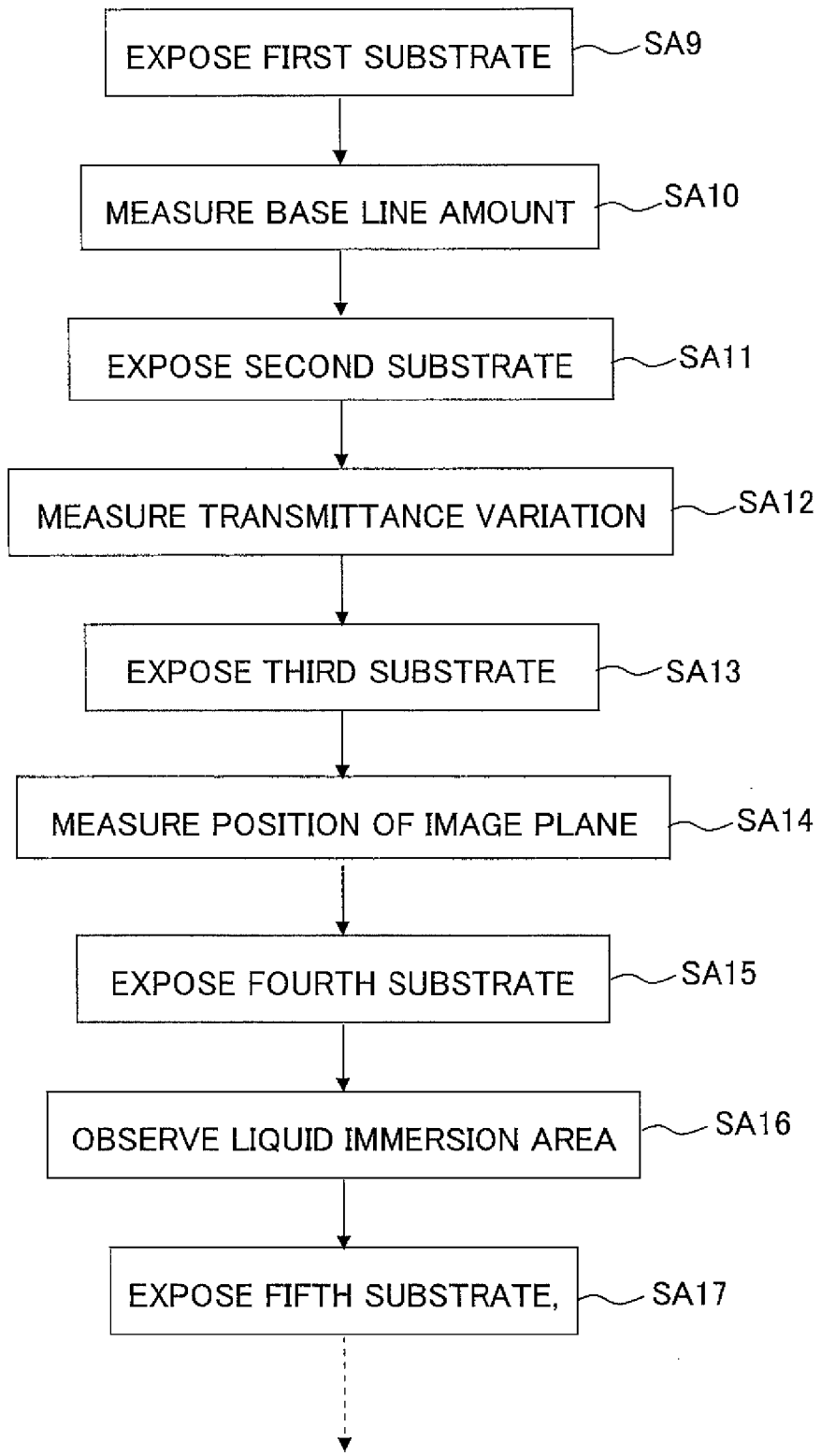
FIG. 9 is a flowchart illustrating an example of a timing of observation performed by the observation unit.

It is also allowable that the observation operation is executed while the liquid LQ1 is retained between the first optical element LS1 of the projection optical system PL and the measuring stage PST2 during the exchange of the substrate P (for example, exchange of an exposed substrate with an unexposed substrate). In this case, the observation operation by the observation unit 60 can be executed every exchange of the substrate P. However, it is also allowable that the observation operation is executed for each predetermined number of processed substrates. FIG. 9 illustrates an example of observation timing of the observation unit 60, showing procedures for executing the observation operation by the observation unit 60 every exposure process of four substrates.

Figure 5:
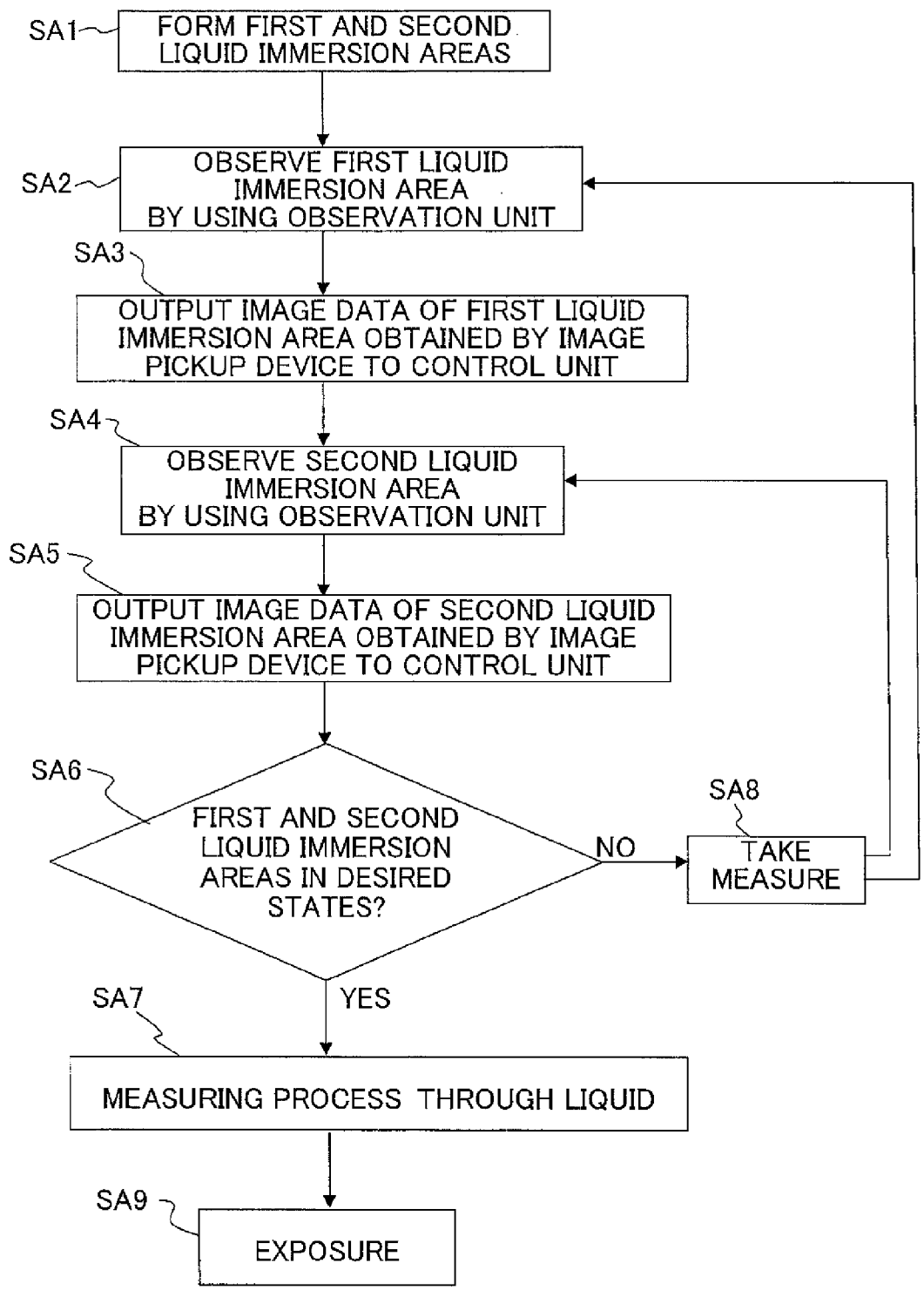
FIG. 5 is a flowchart illustrating an example of exposure procedures.
Figure 6:
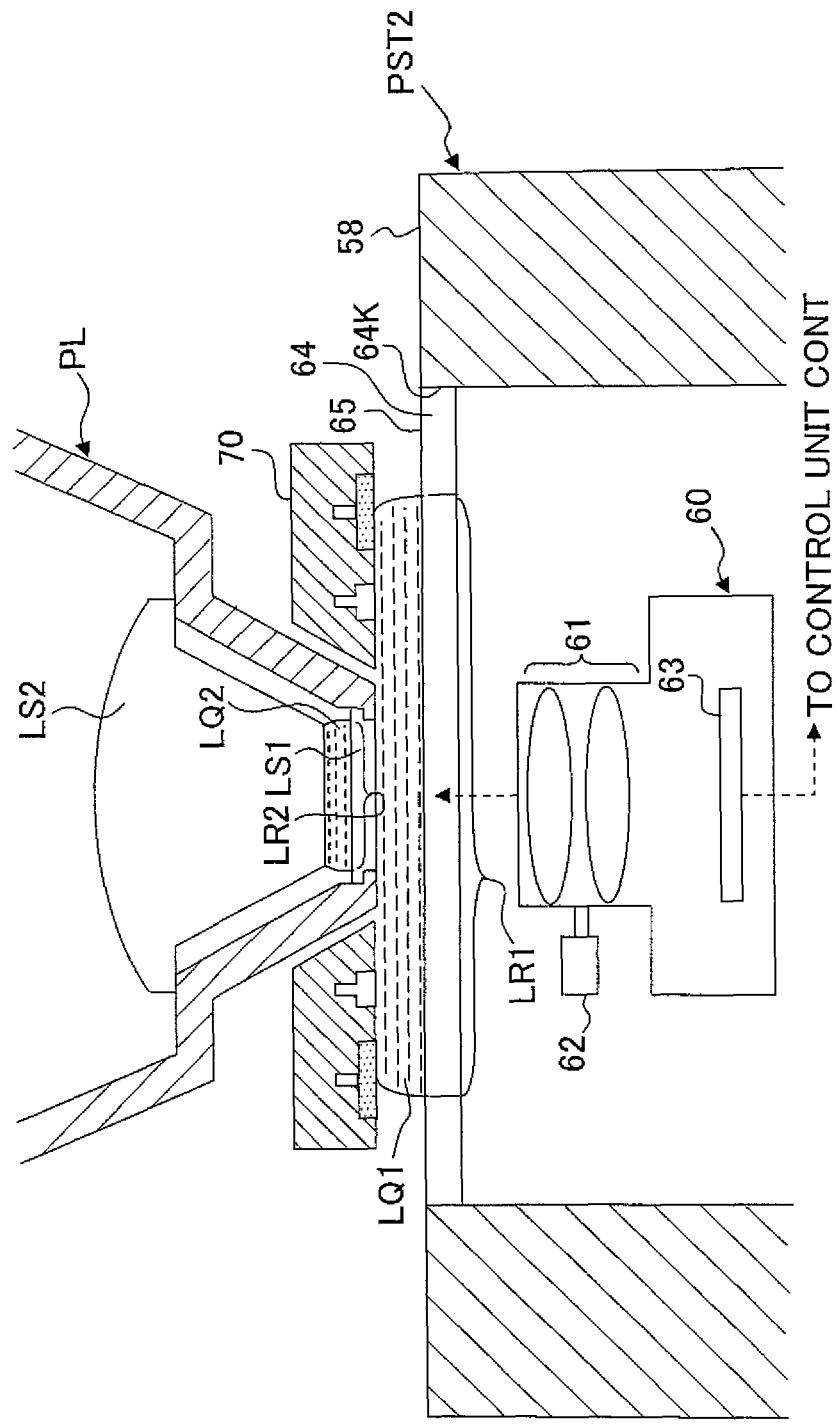
FIG. 6 is a drawing illustrating an observing state of a liquid immersion area by an observation unit.

FIG. 9 shows process procedures continued from the exposure (exposure of the first substrate) of step SA9 described in the flowchart of FIG. 5.

After the exposure process for the first substrate at step SA9, measurement of the baseline amount by using the reference member 300 is executed (step SA10). Next, an exposure process for the second substrate is executed (step SA11), and thereafter, measurement of a variation of transmittance by using the unevenness sensor 400 is executed (step SA12). Next, an exposure process for the third substrate is executed (step SA13), and thereafter, image plane position measurement using the spatial image measuring sensor 500 is executed (step SA14). Next, an exposure process for the fourth substrate is executed (step SA15), and thereafter, observation of the liquid immersion area LR1 by the observation unit 60 is executed (step SA16). Next, an exposure process for the fifth substrate is executed (step SA17), and subsequently, steps SA10 to SA17 are repeated. The flowchart of FIG. 9 merely shows an example, and the order of the operations using the observation unit 60, the reference member 300, and the sensors 400 and 500 can be changed or exchanged as appropriate, and the execution frequencies of the operations can also be determined as appropriate.

The measuring members and the measuring instruments to be provided in the measuring stage PST2 are not limited to those described above, and various measuring members and measuring instruments are installed as appropriate. For example, the wave front aberration measuring instrument disclosed in, for example, International Publication Pamphlet No. 99/60361 (corresponding to U.S. patent application Ser. No. 09/714,183), Japanese Patent Application Laid-open No. 2002-71514, and U.S. Pat. No. 6,650,399, and a reflecting section disclosed in, for example, Japanese Patent Application Laid-open No. 62-183522 may be installed in the measuring stage PST2.

In the above-described embodiment, before and after the substrate exchange operation on the substrate stage PST1, in order to move the first liquid immersion area LR1 from one of the substrate stage PST1 and the measuring stage PST2 to the other of the substrate stage PST1 and the measuring stage PST2, the substrate stage PST1 and the measuring stage PST2 are brought into contact with each other or close to each other. However, the two stages may also be brought into contact with each other or close to each other in other operations as appropriate. For example, an alignment process for detecting a plurality of alignment marks on the substrate P is executed before starting the exposure of the substrate P. However, when there is a possibility that a part of the first liquid immersion area LR1 is removed or detached from the upper surface 51 of the substrate stage PST1 during the alignment process, the two stages may be brought into contact with each other or close to each other to maintain the first liquid immersion area LR1. Also, when there is a possibility that a part of the first liquid immersion area LR1 is removed from the upper surface 51 of the substrate stage PST1 during exposure of the substrate P, in order to maintain the first liquid immersion area LR1, the two stages may be brought into contact with each other or close to each other. Accordingly, the first liquid immersion area LR1 can be maintained even when the area of the upper surface 51 of the substrate stage PST1 is small.

Although any specific description is not given in the flowchart of FIG. 9, between the steps, the first liquid immersion area LR1 is moved from the upper surface of one stage to the upper surface of the other stage, and along with the operations of steps SA10, SA12, SA14, and SA16, the exchange operation of an exposed substrate with a substrate to be exposed next is executed by using the substrate stage PST1.

It is not necessarily indispensable that the first liquid immersion area LR1 and the second liquid immersion area LR2 are observed for every observation operation using the observation unit 60, and either one of the first liquid immersion area LR1 and the second liquid immersion area LR2 may be observed.

Fourth Embodiment

A fourth embodiment will be described. In the embodiment described above, the control unit CONT judges whether or not the liquid immersion area is in a desired state based on the result of observation performed by the observation unit 60 (step SA6 of FIG. 5), and when it is judged that the liquid immersion area is not in the desired state, various measures for eliminating this inconvenience are taken (step SA8 of FIG. 5). However, in this embodiment, when the gas portions such as bubbles are present in the liquid forming the liquid immersion area, the control unit CONT operates to supply liquid LQ that has been degassed, for a predetermined period of time, as a measure for reducing or eliminating the gas portions. Namely, when the control unit CONT judges that, for example, gas portions are present in the second liquid LQ2 forming the second liquid immersion area LR2 based on the result of observation performed by the observation unit 60 provided in the measuring stage PST2, the control unit CONT controls the second liquid immersion mechanism 2 so as to supply the degassed second liquid LQ to the second space K2 between the first optical element LS1 and the second optical element LS2 for a predetermined period of time, and recovers a predetermined amount of the second liquid LQ2 from the second space K2 according to the supply amount of the degassed second liquid LQ2. As described above, since the second liquid supply unit 31 of the second liquid immersion mechanism 2 has a degassing unit for reducing the gas components in the second liquid LQ2, the control unit CONT can sufficiently operates to degas the second liquid LQ2 by using the degassing unit provided in the second liquid supply unit 31 and then control the second liquid immersion mechanism 2 and to supply the degassed second liquid LQ2 to the second space K2 between the first optical element LS1 and the second optical element LS2. Then, by supplying the sufficiently degassed second liquid LQ2 to the second space K2 for the predetermined period of time, the gas portions (bubbles) in the second liquid LQ2 forming the second liquid immersion area LR2 can be reduced or eliminated by dissolving the gas portions into the second liquid LQ2.

Figure 10:
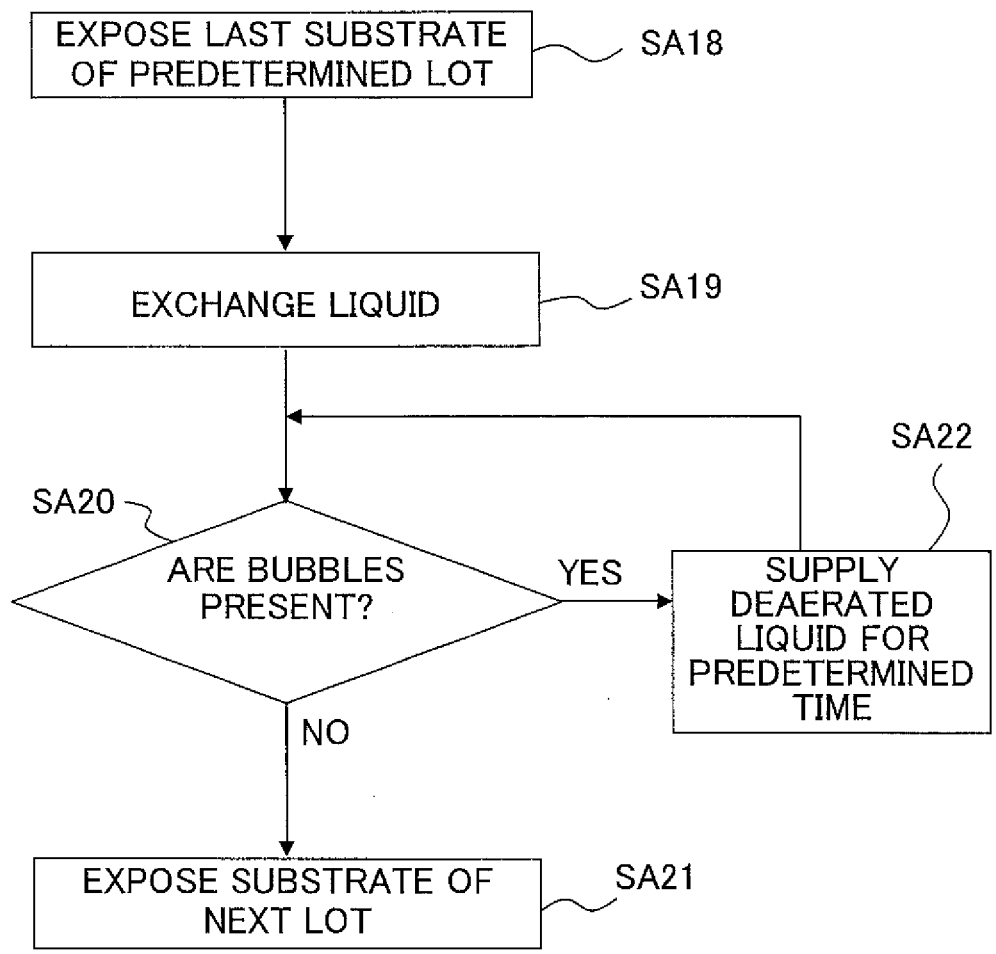
FIG. 10 is a flowchart illustrating an example of exposure procedures according to a fourth embodiment.

FIG. 10 is a flowchart for describing an example of an operation for supplying the degassed second liquid LQ2 for the predetermined period of time. Here, the description is given by way of example in which the observation operation by the observation unit 60 is performed when the second liquid LQ2 is exchanged. The term "exchange of the second liquid LQ2" means that, when the second space K2 between the first optical element LS1 and the second optical element LS2 is filled with the second liquid LQ2, the operation for supplying the second liquid LQ2 to the second space K2 and the operation for recovering the second liquid LQ2 from the second space K2 by the second liquid immersion mechanism 2 are simultaneously performed so that the second liquid LQ2 previously filled in the second space K2 is recovered and a clean fresh second liquid LQ2 adjusted to a predetermined temperature is supplied to the second space K2.

In this embodiment, the operation for exchanging the second liquid LQ2 in the second liquid immersion area LR2 is performed for each lot of the substrates P (for each predetermined number of processed substrates). During exposure of the substrate P, the second space K2 between the first optical element LS1 and the second optical element LS2 is filled with the second liquid LQ2. However, the operations for supplying and recovering the second liquid LQ2 by the second liquid immersion mechanism 2 are not performed. Accordingly, vibration due to the liquid supply and recovering by the second liquid immersion mechanism 2 can be prevented. Then, by exchanging the second liquid LQ2 in the second liquid immersion area LR2 for each lot of the substrates P (for each predetermined number of processed substrates), the second space K2 can be filled with the second liquid LQ2 at a desired temperature.

When exchanging the second liquid LQ2 in the second liquid immersion area LR2, it is preferable that the second liquid LQ2 previously filled in the second space K2 and a fresh second liquid LQ2 are gradually exchanged without completely removing the second liquid LQ2 from the second space K2 so that the second space K2 is always filled with the second liquid LQ2. By doing so, it is possible to suppress the generation of gas portions (bubbles) in the second liquid LQ2 in the second liquid immersion area LR2 accompanying with the exchange of the second liquid LQ2 in the second liquid immersion area LR2.

After the exposure of the last substrate P of a predetermined lot is finished (step SA18), the control unit CONT operate to exchange the second liquid LQ2 in the second liquid immersion area LR2 (step SA19). The control unit CONT simultaneously performs the operation for supplying the second liquid LQ2 to the second space K2 and the operation for recovering the second liquid LQ2 from the second space K2 by the second liquid immersion mechanism 2 so as to exchange the second liquid LQ2 in the second liquid immersion area LR2. After the exposure of the last substrate P of the predetermined lot is completed, the control unit CONT operates to move the measuring stage PST2 to a position opposite to or facing the projection optical system PL, and starts the operation for exchanging the second liquid LQ2 in a state that the second liquid LQ2 in the second liquid immersion area LR2 can be observed by the observation unit 60 provided to the measuring stage PST2.

After the exchange of the second liquid LQ2 in the second liquid immersion area LR2 is completed, the control unit CONT operates to observe the state of the second liquid immersion area LR2 by using the observation unit 60. Then, the control unit CONT judges whether or not gas portions (bubbles) are present in the second liquid LQ2 in the second liquid immersion area LR2 based on the result of observation performed by the observation unit 60 (step SA20).

At step SA20, when the control unit CONT judges that no babbles are present in the second liquid LQ2 forming the second liquid immersion area LR2, the control unit CONT executes exposure of a substrate P of the next lot (step SA21).

On the other hand, when the control unit CONT judges that bubbles are present in the second liquid LQ2 forming the second liquid immersion area LR2, the control unit CONT controls the second liquid immersion mechanism 2 so as to supply the degassed second liquid LQ2 for a predetermined period of time (step SA22). Here, the liquid supply amount per unit time when supplying the second liquid LQ2 to the second space K2 to reduce or eliminate bubbles may be approximately equal to the liquid supply amount per unit time when exchanging the second liquid LQ2 in the second liquid immersion area LR2. Alternatively, the liquid supply amount per unit time when supplying the second liquid LQ2 to the second space K2 to reduce or eliminate bubbles may be greater than the liquid supply amount per unit time when exchanging the second liquid LQ2 in the second liquid immersion area LR2.

Figure 11:
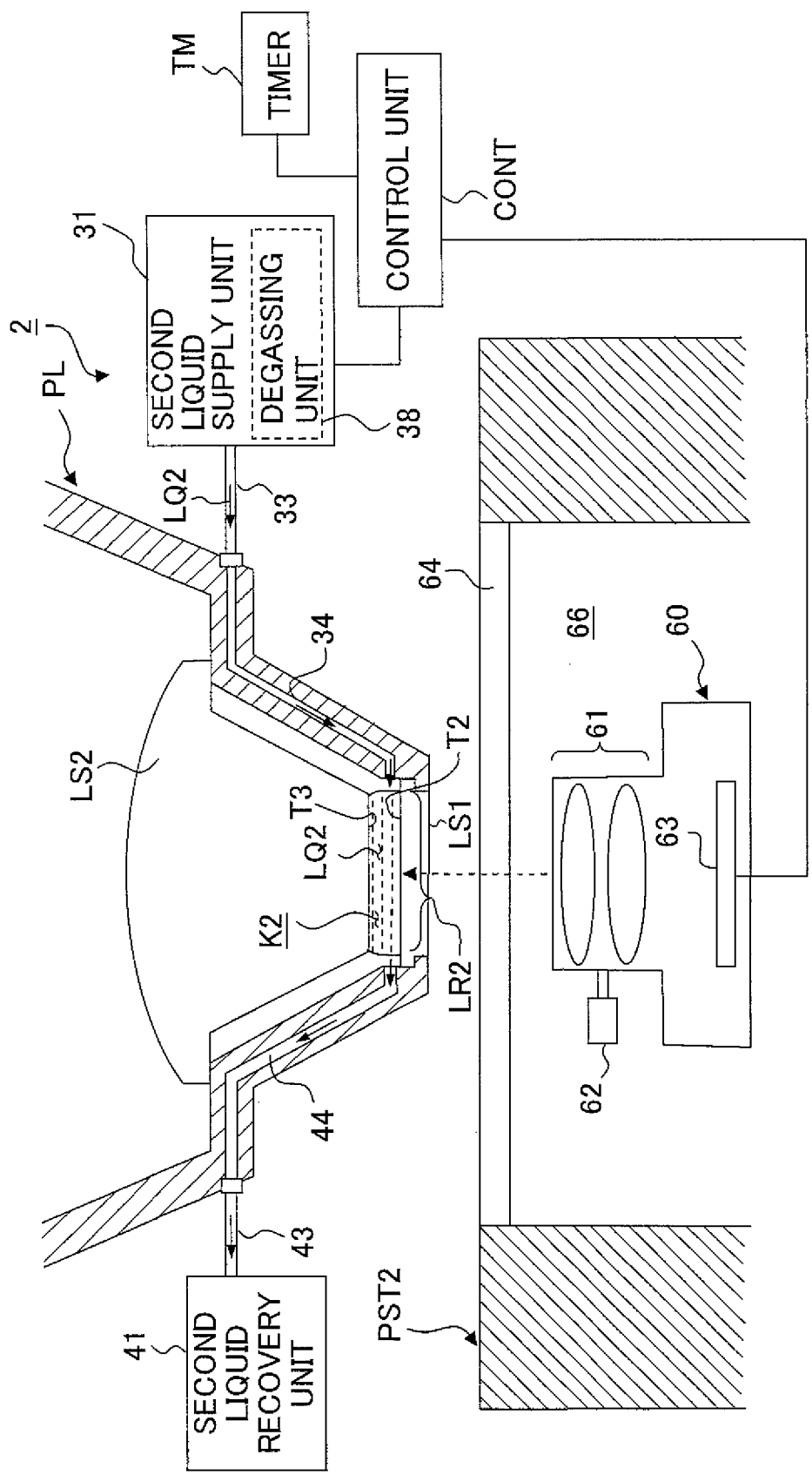
FIG. 11 is a drawing illustrating major parts of an exposure apparatus according to the fourth embodiment.

FIG. 11 illustrates a state that the degassed second liquid LQ2 is supplied to the second space K2 after it is judged that bubbles are present in the second liquid LQ2 forming the second liquid immersion area LR2. As shown in FIG. 11, the control unit CONT operates to supply the degassed second liquid LQ2 from the second liquid supply unit 31 of the second liquid immersion mechanism 2 to the second space K2 while observing the state of the second liquid immersion area LR2 by the observation unit 60. In FIG. 11, the first liquid immersion area LR1 is not formed. The control unit CONT operates to supply the sufficiently degassed second liquid LQ2 to the second space K2 from the second liquid supply unit 31 until the size or amount of bubbles in the second liquid LQ2 forming the second liquid immersion area LR2 becomes not more than a predetermined level and recovers the second liquid LQ2 in the second space K2 by the second liquid recovery unit 41 while observing the state of the second liquid immersion area LR2 by using the observation unit 60. By continuously supplying the sufficiently degassed second liquid LQ2 to the second space K2 for the predetermined period of time, the bubbles contained in the second liquid LQ2 in the second liquid immersion area LR2 can be reduced or eliminated. For example, even when bubbles adhere to the upper surface T2 of the first optical element LS1 or the lower surface T3 of the second optical element LS2, the bubbles can be eliminated by continuously supplying the sufficiently degassed second liquid LQ2 to the second space K2 for the predetermined period of time.

The second liquid LQ2 to be supplied to the second space K2 to reduce or eliminate the bubbles is the same as the liquid to be filled in the second space K2 when exposing the substrate P. In this embodiment, a degassing unit 38 provided in the second liquid supply unit 31 degasses the second liquid LQ2 such that the dissolved gas concentration of the second liquid LQ2, to be supplied to the second space K2 to reduce or eliminate the bubbles, becomes not more than 5 ppm. More specifically, the degassing unit 38 degasses the second liquid LQ2 so as to satisfy at least one of conditions of a dissolved oxygen concentration of not more than 5 ppm, a dissolved carbon dioxide gas concentration of not more than 5 ppm, and a dissolved nitrogen concentration of not more than 5 ppm. By suppressing the dissolved gas concentration of the second liquid LQ2 to be supplied to the second space K2 to be not more than 5 ppm, the bubbles in the second liquid LQ2 forming the second liquid immersion area LR2 can be reduced or eliminated by being dissolved into the second liquid LQ2.

Figure 12:
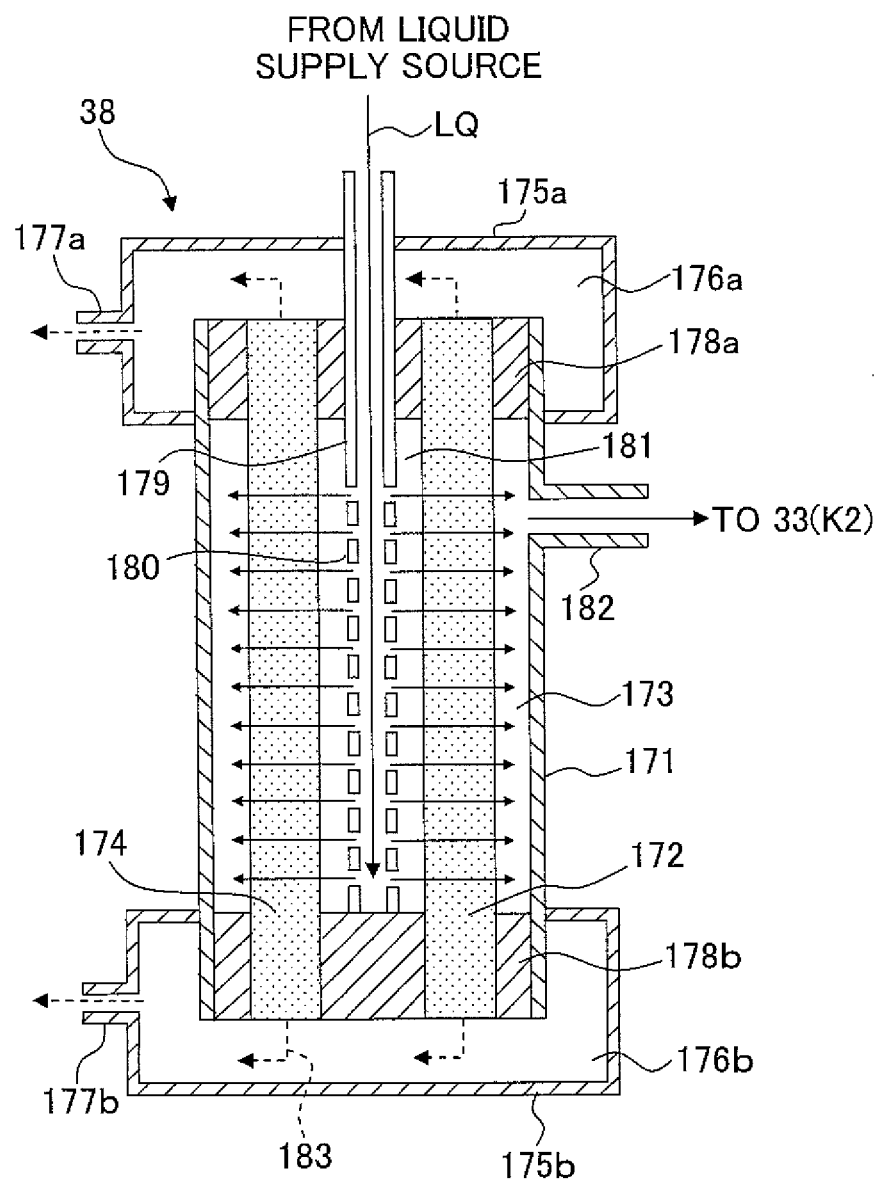
FIG. 12 is a drawing illustrating an example of a degassing unit.

FIG. 12 is a sectional view illustrating a schematic construction of the degassing unit 38. A cylindrical hollow fiber bundle 172 is accommodated inside a housing 171 via a predetermined space 173. The hollow fiber bundle 172 is a plurality of straw-like hollow fiber membranes 174 bundled in parallel, and each of the hollow fiber membranes 174 is made of a material having high hydrophobicity and excellent gas permeability (for example, poly-4-methylpenten-1). To both ends of the housing 171, vacuum cap members 175a and 175b are fixed, and sealed spaces 176a and 176b are formed on the outer sides of both ends of the housing 171. In the vacuum cap members 175a and 175b, degassing ports 177a and 177b connected to a vacuum pump that is not shown are formed. In both ends of the housing 171, sealed portions 178a and 178b are formed so that only the both ends of the hollow fiber bundle 172 are joined to the sealed spaces 176a and 176b, and the insides of the hollow fiber membranes 174 can be decompressed by the vacuum pump connected to the degassing ports 177a and 177b. Inside the hollow fiber bundle 172, a tube 179 connected to a predetermined liquid supply source is arranged. In the tube 179, a plurality of liquid supply holes 180 are provided so that the liquid LQ is supplied from the liquid supply holes 180 to the space 181 surrounded by the sealed portions 178a and 178b and the hollow fiber bundle 172. When the liquid LQ is continuously supplied from the liquid supply holes 180 to the space 181, the liquid LQ flows outwardly across the layers of the hollow fiber membranes 174 bundled in parallel, and the liquid LQ comes into contact with the outer surfaces of the hollow fiber membranes 174. As described above, each of the hollow fiber membranes 174 is made of a material having high hydrophobicity and excellent gas permeability, so that the liquid LQ moves to the space 173 outside the hollow fiber bundle 172 through spaces or gaps between the hollow fiber membranes 174 without entering the insides of the hollow fiber membranes 174. On the other hand, the gases (molecules) dissolved in the liquid LQ are moved (absorbed) to the insides of the respective hollow fiber membranes 174 due to the decompression state (about 20 Torr) in the insides of the hollow fiber membranes 174. The gas components, thus removed (degassed) from the liquid LQ during a period of time in which the liquid LQ passes across the layers of the hollow fiber membranes 174, are exhausted or discharged from the degassing ports 177a and 177b, via the sealed spaces 176a and 176b, from both ends of the hollow fiber bundle 172 as shown by the arrow 183. The degassed liquid LQ is supplied to the second supply tube 33 (second space K2) from a liquid outlet port 182 formed in the housing 151. In this embodiment, the second liquid supply unit 31 suppresses the dissolved gas concentration of the second liquid LQ2 to be supplied to the second space K2 to be not more than 5 ppm by using the degassing unit 38.

Since the control unit CONT can operates to obtain the size and amount of bubbles in the second liquid LQ2 in the second liquid immersion area LR2 based on the result of observation of the observation unit 60, the time during which the degassed second liquid LQ2 is supplied from the second liquid supply unit 31 can be adjusted according to the size or amount of the bubbles in the second liquid LQ2 in the second liquid immersion area LR2. To the control unit CONT, a timer TM is connected, and the control unit CONT can manage the time by using the timer TM, and can reduce or eliminate bubbles in the second liquid LQ2 forming the second liquid immersion area LR2 by supplying the degassed second liquid LQ2 to the second space K2 for a predetermined period of time while managing the time. Specifically, when the size of the bubbles is great or the amount of bubbles is great, the control unit CONT lengthens the supply time of the degassed second liquid LQ2, and when the size of the bubbles is small or the amount of the bubbles is small, the control unit CONT shortens the supply time of the degassed second liquid LQ2. Accordingly, when the size of the bubbles is great or the amount of the bubbles is great, the bubbles can be reliably reduced or eliminated, and when the size of the bubbles is small or the amount of the bubbles is small, it is possible to prevent the degassed second liquid LQ2 from being supplied unnecessarily even after the bubbles are reduced or eliminated.

The control unit CONT can also adjust the liquid supply amount per unit time when supplying the degassed second liquid LQ2 from the second liquid supply unit 31 according to the size or amount of the bubbles in the second liquid LQ2 in the second liquid immersion area LR2. For example, when the size of the bubbles is great or the amount of the bubbles is great, the control unit CONT increases the liquid supply amount per unit time when supplying the degassed second liquid LQ2, and when the size of the bubbles is small or the amount of the bubbles is small, reduces the liquid supply amount per unit time when supplying the degassed second liquid LQ2.

Then, after supplying the degassed second liquid LQ2 for a predetermined period of time, when it is confirmed, based on the result of observation performed by the observation unit 60, that the size or amount of the bubbles in the second liquid LQ2 forming the second liquid immersion area LR2 is not more than a predetermined level, exposure for the substrate P of the next lot is started.

In this embodiment, the control unit CONT operates to supply the degassed second liquid LQ2 to the second space K2 for a predetermined period of time while observing the state of the second liquid immersion area LR2 by the observation unit 60. However, it is not necessarily indispensable that the state of the second liquid immersion area LR2 is continuously observed by using the observation unit 60 during the supply of the degassed second liquid LQ2 to the second space K2. For example, it is also allowable that, at a first point of time, the control unit CONT operates to observe the state of the second liquid immersion area LR2 by using the observation unit 60, and after judging that bubbles are present in the second liquid LQ2 forming the second liquid immersion area LR2 based on the result of observation performed by the observation unit 60, the control unit CONT operates to supply the degassed second liquid LQ2 from the second liquid supply unit 31 for a predetermined period of time without performing the observation by the observation unit 60. Then, after the predetermined period of time elapses, at a second point of time, by confirming whether or not the bubbles in the second liquid LQ2 in the second liquid immersion area LR2 have been reduced or eliminated by using the observation unit 60, the control unit CONT can judge whether or not the substrate of the next lot of substrates are to be exposed or the supply of the degassed second liquid LQ2 are to be continued. Also in this case, since the control unit CONT can operate to obtain the size or amount of the bubbles in the second liquid immersion area LR2 based on the result of observation performed by the observation unit 60 at the first point of time, the control unit CONT can adjust the supply time during which the degassed second liquid LQ2 is supplied according to the size or amount of the bubbles. When adjusting the supply time of the degassed second liquid LQ2, the control unit CONT can adjust the supply time while monitoring the timer TM.

In this embodiment, after the exchange of the second liquid LQ2 in the second liquid immersion area LR2 is completed, the observation unit 60 observes the state of the second liquid immersion area LR2. However, as a matter of course, it is also possible that the state of the second liquid immersion area LR2 is observed by the observation unit 60 while the second liquid LQ2 in the second liquid immersion area LR2 is exchanged.

As shown in FIG. 11, when the observation unit 60 is provided in the measuring stage PST2, the observation operation of the observation unit 60 and the operation for exchanging the substrate P on the substrate stage PST1 (operation for exchanging the last substrate of a predetermined lot with a substrate of the next lot) can be concurrently performed. On the other hand, as described in the third embodiment, the observation unit 60 may be provided in the substrate stage PST1. In this case, before or after the observation operation of the observation unit 60, the operation for exchanging the substrate P on the substrate stage PST1 can be performed. In FIG. 11, when observing the state of the second liquid immersion area LR2 by using the observation unit 60, the first liquid immersion area LR1 is not formed. However, the first liquid immersion area LR1 may be formed. In this case, the observation unit 60 observes the second liquid immersion area LR2 through the first liquid LQ1 in the first liquid immersion area LR1. On the other hand, as shown in FIG. 11, by not forming the first liquid immersion area LR1 when observing the state of the second liquid immersion area LR2 by using the observation unit 60, the presence or absence of bubbles in the second liquid LQ2 forming the second liquid immersion area LR2 can be more accurately observed.

In this embodiment, the operation for exchanging the second liquid LQ2 in the second liquid immersion area LR2 is performed for each lot of the substrates P (that is, every exchange of the mask M on the mask stage MST). However, the operation for exchanging the second liquid LQ2 in the second liquid immersion area LR2 may be performed at predetermined time intervals or for each predetermined number of processed substrates.

In this embodiment, the observation operation of the observation unit 60 is performed every time the second liquid LQ2 in the second liquid immersion area LR2 is exchanged. However, the observation operation may be performed at a time other than the time of exchange of the second liquid LQ2 in the second liquid immersion area LR2. For example, it is also allowable that when supplying the second liquid LQ2 to the second space K2 having been contained no second liquid LQ2, the observation unit 60 performs the observation. Alternatively, even in the middle of one lot, the projection optical system PL faces the measuring stage PST2 during the exchange of the substrate P on the substrate stage PST1. Accordingly, when the observation unit 60 is provided in the measuring stage PST2, the second liquid immersion area LR2 can be observed during this exchange of the substrate in the middle of the lot. When it is judged that bubbles are present in the second liquid LQ2 forming the second liquid immersion area LR2 based on the result of observation performed by the observation unit 60, instead of performing the exposure for the substrate P loaded on the substrate stage PST1, the control unit CONT can operate to supply the degassed second liquid LQ2 to the second space K2 for the predetermined period of time to reduce or eliminate the bubbles in the second liquid immersion area LR2.

In this embodiment, the operation for exchanging the second liquid LQ2 in the second liquid immersion area LR2 is performed for each lot (or at predetermined time intervals or for each predetermined number of processed substrates). However, it is also allowable that the second liquid immersion mechanism 2 always performs the operation for supplying the second liquid LQ2 to the second space K2 and the operation for recovering the second liquid LQ2 from the second space K2 even during exposure of the substrate P. In this case, during non-exposure operations such as exchange of the substrate P, the state of the second liquid immersion area LR2 (second liquid LQ2) is observed, and when it is judged that bubbles are present in the second liquid LQ2, the control unit CONT performs the operation for supplying the degassed second liquid and the operation for recovering the degassed second liquid so as to reduce or eliminate the bubbles in the second liquid LQ2, instead of starting the exposure for the next substrate P. At this time, the liquid supply amount per unit time when supplying the degassed second liquid LQ2 to the second space K2 to reduce or eliminate the bubbles may be equal to the liquid supply amount per unit time when supplying the second liquid LQ2 to the second space K2 when exposing the substrate P, or the liquid supply amount per unit time when supplying the degassed second liquid LQ2 to the second space K2 to reduce or eliminate the bubbles when exposing the substrate P may be greater than the liquid supply amount per unit time when supplying the second liquid LQ2 to the second space K2 when exposing the substrate P.

In this embodiment, when it is judged that bubbles are present in the second liquid LQ2 forming the second liquid immersion area, the degassed second liquid LQ2 is supplied to the second space K2 for a predetermined period of time to reduce or eliminate the gas portions. However, it is also allowable that, when it is judged that bubbles are present in the second liquid LQ2 foaming the second liquid immersion area LR2, without managing the liquid supply time during which the degassed second liquid LQ2 is supplied, the second liquid LQ2 forming the second liquid immersion area LR2 is continuously or intermittently observed by the observation unit 60 while supplying the degassed second liquid LQ2 to the second space K2, and when it is judged that the gas portions in the second liquid LQ2 have been reduced to a level affecting no influence on the exposure or measurement or disappeared, the supply of the degassed second liquid LQ2 is stopped and/or the exposure light beam EL is radiated.

In this embodiment, when it is judged that bubbles are present in the second liquid LQ2 forming the second liquid immersion area LR2, degassed second liquid LQ2 is supplied to the second space K2 for a predetermined period of time. However, it is also allowable that the control unit CONT controls the first liquid immersion mechanism 1 so as to supply degassed first liquid LQ1 for a predetermined period of time when the control unit CONT judges that bubbles are present in the first liquid LQ1 forming the first liquid immersion area LR1 based on the result of observation performed by the observation unit 60. Since the first liquid supply unit 11 of the first liquid immersion mechanism 1 also includes the degassing unit, the first liquid supply unit 11 of the first liquid immersion mechanism 1 can supply degassed first liquid LQ1.

Fifth Embodiment

In each of the above-described embodiments, when executing the observation operation using the observation unit 60, the liquid immersion areas LR1 and LR2 may be illuminated with light from a light source as will be explained in this embodiment. In this embodiment, various illumination methods and apparatuses and structures for the methods will be explained. For example, exposure light beam EL can be used as illumination light, and in this case, the intensity of the exposure light beam EL may be lowered. As a material of the transparent member 64, a transparent material (for example, calcium fluoride, silica glass, etc.) is selected as appropriate according to the wavelength of the exposure light beam EL. It is preferable that a high-sensitivity image pickup device and/or detection element are used according to the wavelength of the exposure light beam EL.

Figure 13:
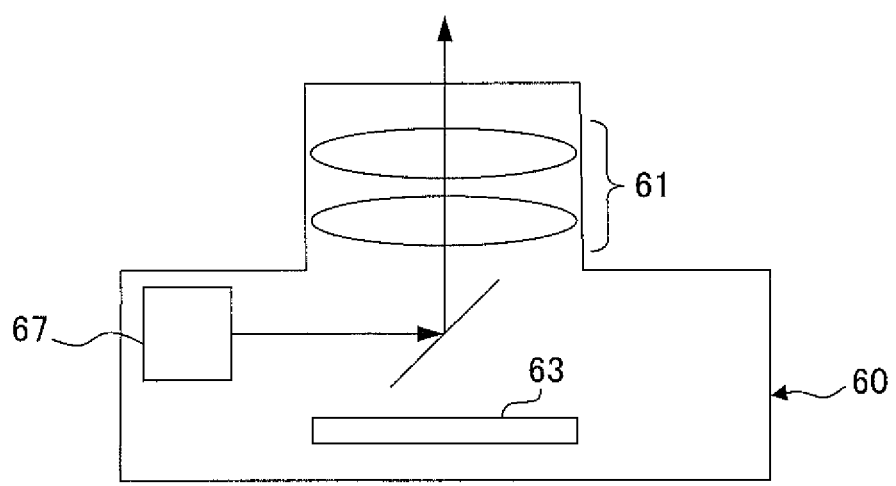
FIG. 13 is a schematic view illustrating an observation unit including an illumination light source.

As shown in FIG. 13, the observation unit 60 may be provided with a light source 67 for illumination. As a light source for illumination, for example, an LED (white LED, etc.) or an EL device (inorganic EL sheet, etc.) can be used. As a method for illumination with illumination light, a dark field illumination method or a bright field illumination method can be used, and it is also possible to make the dark field illumination method and the bright field illumination method to be switchable. In this case, for example, it is possible to observe whether or not the spaces K1 and K2 are sufficiently filled with the liquids LQ1 and LQ2, respectively, by using the bright field illumination method, and it is possible to observe whether or not small bubbles and particles enter and are mixed in the liquids LQ1 and LQ2 by using the dark field illumination method.

Figure 14:
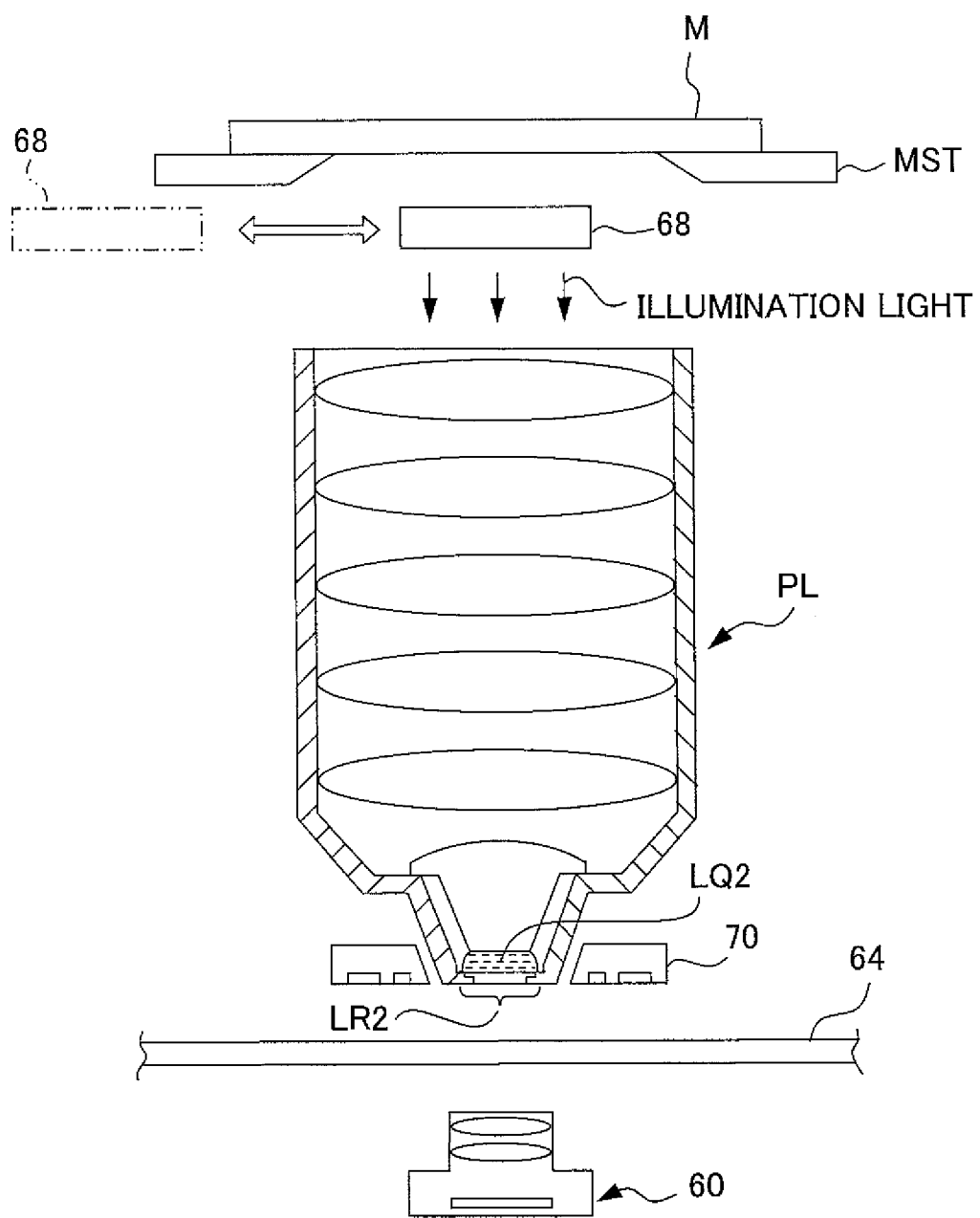
FIG. 14 is a schematic view illustrating an example of an illumination unit which illuminates a liquid immersion area.

As shown in FIG. 14, it is also allowable that an illumination unit 68 for illuminating the second liquid immersion area LR2 is arranged at a position over or above the second liquid immersion area LR2, that is, at a position opposite to or facing the observation unit 60 with the second liquid immersion area LR2 being intervened therebetween so as to illuminate the second liquid immersion area LR2 with illumination light from above. The illumination unit 68 can be constructed by, for example, an LED (white LED, etc.) or an EL device (inorganic EL sheet). The illumination unit 68 shown in FIG. 14 is provided in a manner enabling the illumination unit 68 to advance to and withdraw from the optical path space of the exposure light beam EL, and when observing the second liquid immersion area LR2 by using the observation unit 60, the control unit CONT operates to arrange the illumination unit 68 in the optical path space of the exposure light beam EL and to irradiate illumination light radiated from the illumination unit 68 onto the second liquid immersion area LR2 from above. The illumination light radiated from the illumination unit 68 passes through each of the optical elements of the projection optical system PL, and thereafter, the illumination light can illuminate the second liquid immersion area LR2 in the second space K2. To make the exposure light beam EL pass via the projection optical system PL to expose the substrate P, the control unit CONT operates to withdraw the illumination unit 68 from the optical path space of the exposure light beam EL. In the example shown in FIG. 14, the illumination unit 68 is arranged between the mask stage MST (mask M) and the projection optical system PL. However, the illumination unit 68 may be arranged above or over the mask stage MST (mask M).

Figure 15:
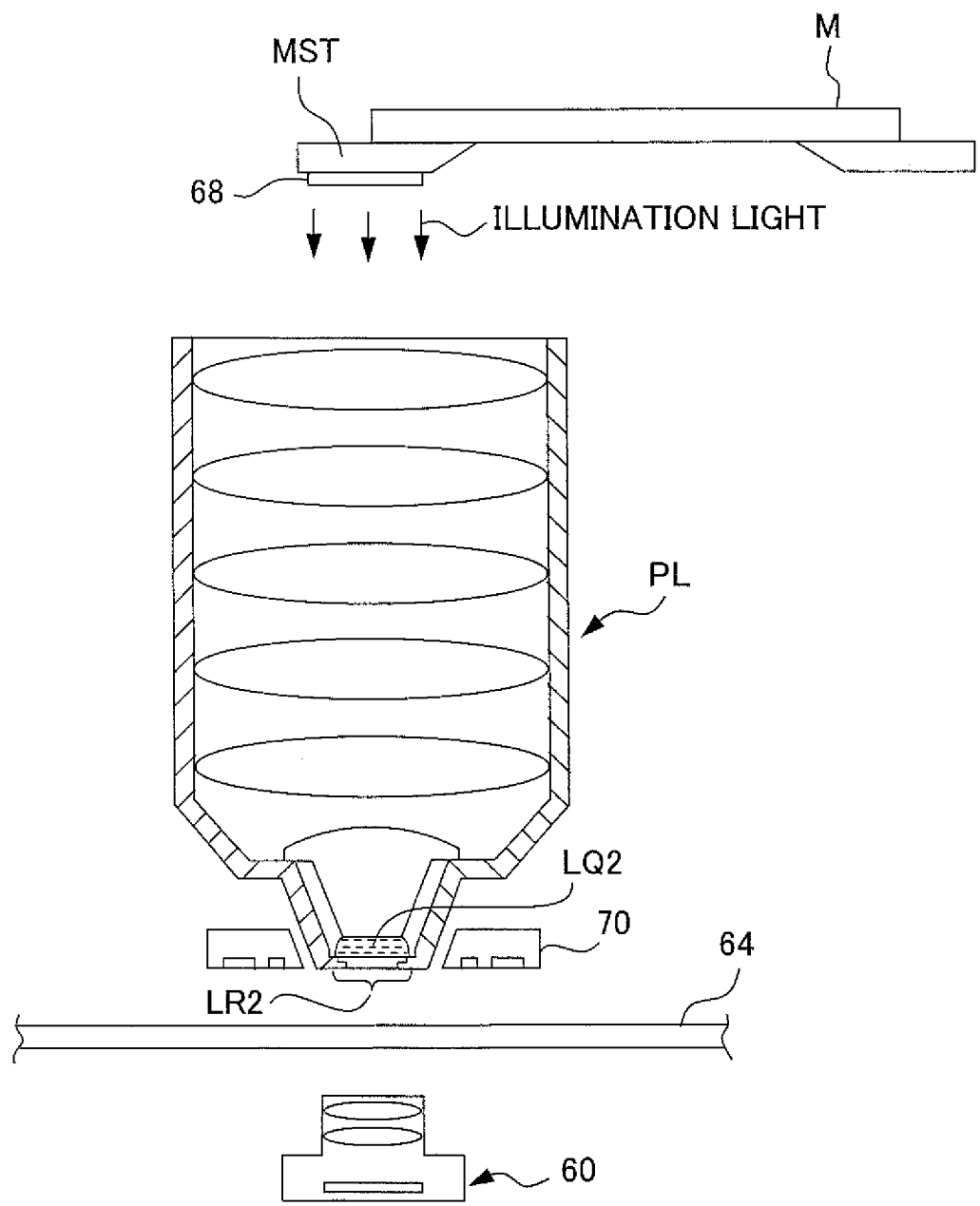
FIG. 15 is a schematic view illustrating an example of an illumination unit which illuminates a liquid immersion area.

Alternatively, as shown in FIG. 15, the illumination unit 68 may be attached to the lower surface of the mask stage MST. Also in this case, illumination light can be irradiated to the second liquid immersion area LR2 from above. When observing the second liquid immersion area LR2 by using the observation unit 60, the control unit CONT operates to arrange the illumination unit 68 above or over the projection optical system PL by driving the mask stage MST and to irradiate illumination light radiated from the illumination unit 68 onto the second liquid immersion area LR2 from above via each of the optical elements of the projection optical system PL.

Figure 16:
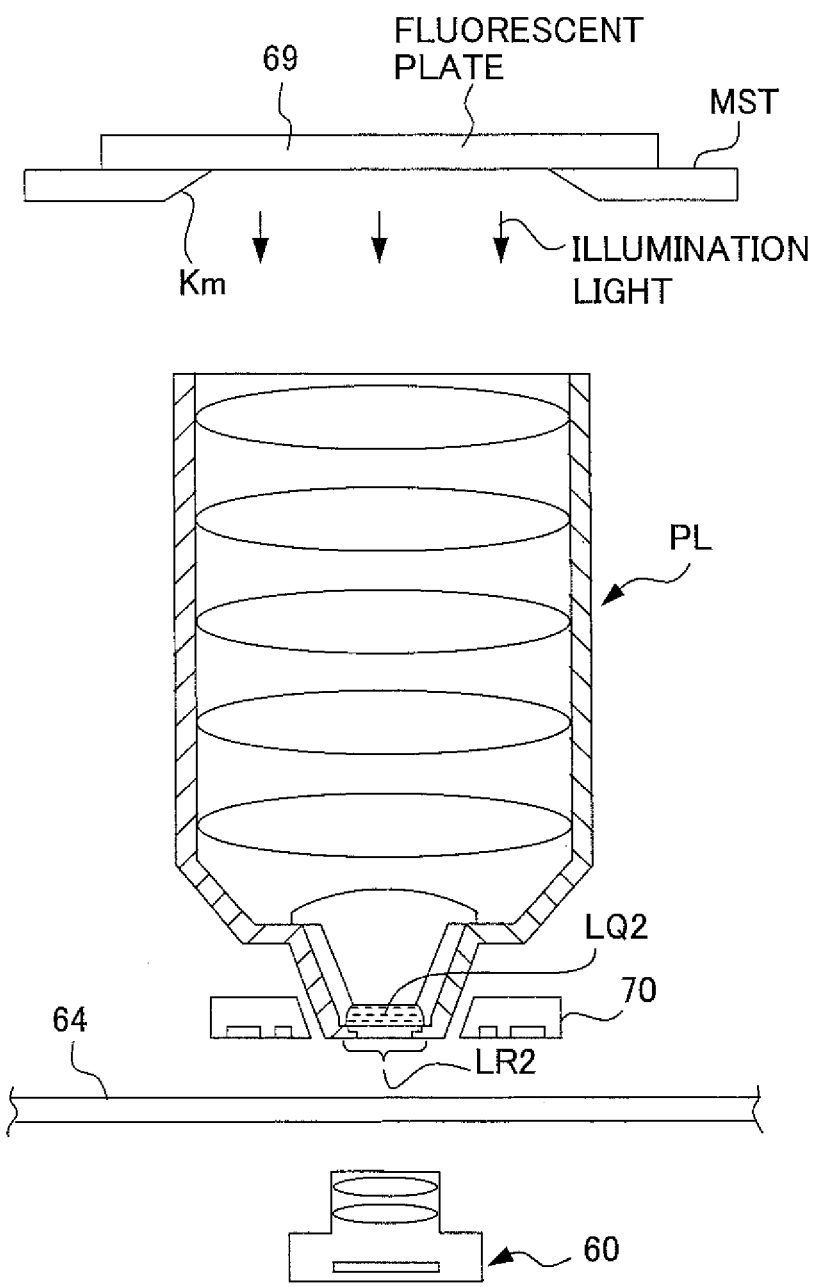
FIG. 16 is a schematic view illustrating an example of an illumination unit which illuminates a liquid immersion area.

As shown in FIG. 16, it is also possible that a fluorescent member (fluorescent plate) 69 is held by the mask stage MST, and light (illumination light) generated from the fluorescent plate 69 is radiated onto the second liquid immersion area LR2 from above. In the mask stage MST, an opening Km through which the exposure light beam EL passes is provided, and the light generated from the fluorescent plate 69 passes through this opening Km and then radiates onto the second liquid immersion area LR2 via the optical elements of the projection optical system PL. To make the fluorescent plate 69 fluoresce, for example, the exposure light beam EL is radiated onto the fluorescent plate 69. Alternatively, a fluorescent plate opening separate from the opening Km may be formed at a part of the mask stage MST and the fluorescent plate may be fixed to this fluorescent plate opening.

It is also possible that the first liquid immersion area LR1 is illuminated with the illumination light described above with reference to FIG. 14 to FIG. 16.

Figure 17:
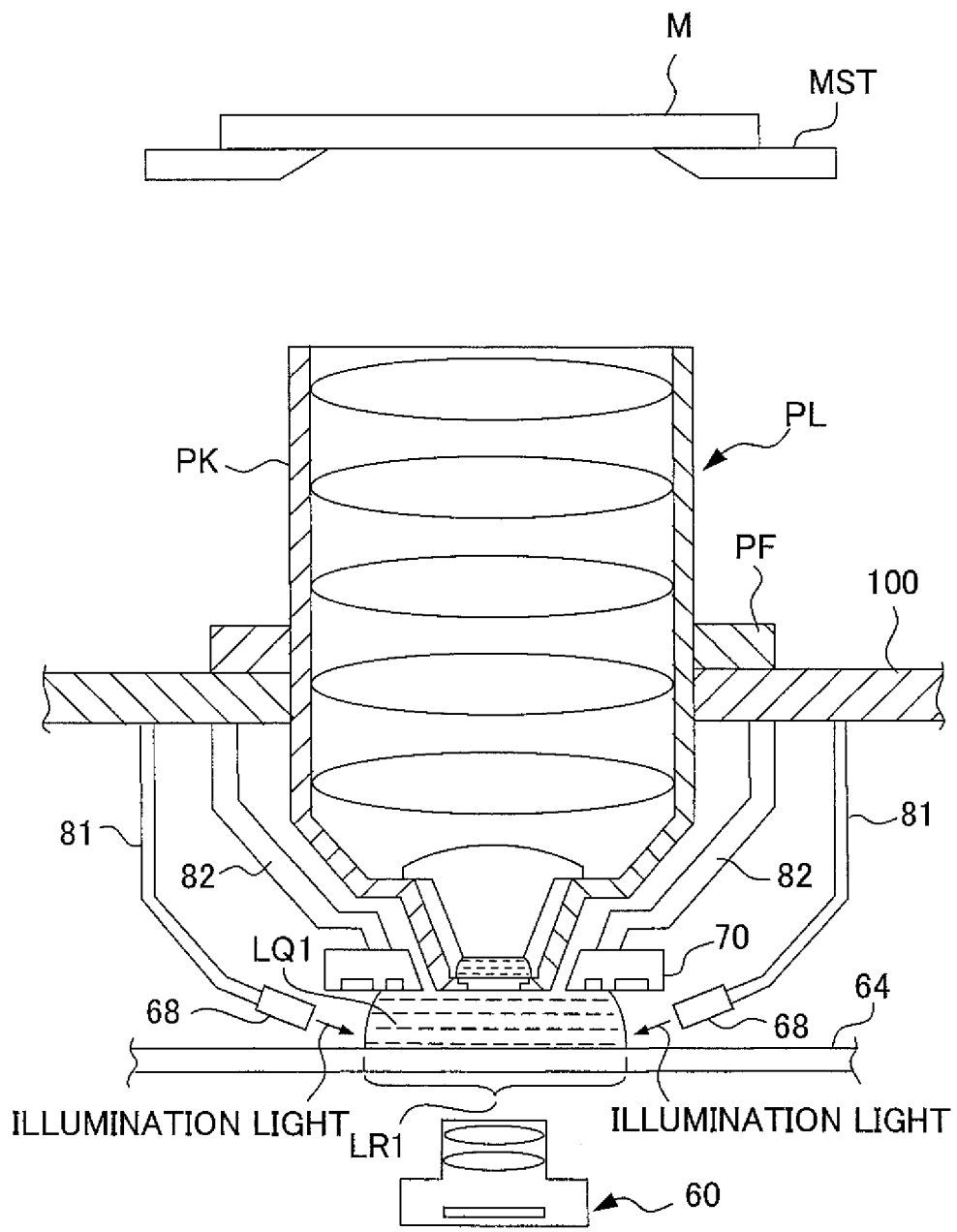
FIG. 17 is a schematic view illustrating an example of an illumination unit which illuminates a liquid immersion area.

As shown in FIG. 17, the illumination unit 68 is provided in the vicinity of the nozzle member 70, and by radiating illumination light from this illumination unit 68, the first liquid immersion area LR1 can be illuminated with this illumination light obliquely. in the example of FIG. 17, the illumination unit 68 is supported on a part of the body (column) 100 of the exposure apparatus EX via a first supporting mechanism 81. The column 100 supports a flange PF provided to the barrel PK of the projection optical system PL. The column 100 can support the nozzle member 70 via a second supporting mechanism 82.

In the explanation above, the states of the liquids (LQ1 and LQ2) forming the liquid immersion areas (LR1 and LR2) are observed via the transparent member 64. However, it is also allowable that an observation unit (for example, an image pickup device and/or a bubble detector) is provided in place of the illumination unit 68 shown in FIG. 17 so as to observe the first liquid LQ1 forming the first liquid immersion area LQ1 from a position lateral to the first liquid LQ1. As such an observation unit, for example, the bubble detector disclosed in WO2004/053958 may be used. This bubble detector includes a projection system and a detection system arranged at positions away from the optical axis of the projection optical system. More specifically, the projection system and the detection system are provided in the scanning direction (X direction) so as to sandwich the projection area of the projection optical system therebetween, and detecting light is made incident obliquely on the liquid immersion area from a plurality of projection units of the projection system, and when no bubbles are present in the liquid immersion area, the detecting light is reflected by the bottom surface or interface (upper surface of the transparent member 64 in this application) of the liquid immersion area and received by a light receiving system. When bubbles are present in the liquid immersion area, since the light is scattered due to the bubbles, the light is received by another light receiving system arranged at a position different from the position at which the aforementioned light receiving system is arranged, and based on the light receiving amount, the amount of the bubbles is obtained (dark field detection). Regarding the bubble detector, a method for detecting bubbles, and control based on the result of detection, the contents of WO2004/053958 is incorporated herein by reference as a part of the description of this application. An observation unit, which can observe (check) the state of the first liquid LQ1 forming the first liquid immersion area LR1 from a position lateral to the first liquid LQ1 in a state that the measuring stage PST2 does not face the projection optical system PL, may be provided in the measuring stage PST2. In this case, for example, even during exposure of the substrate P held on the substrate stage PST1, the state of the first liquid immersion area LR1 formed on the substrate stage PST1 (substrate P) (the presence or absence of bubbles in the liquid LQ1 and leakage of the liquid LQ1) can be checked by using the observation unit provided in the measuring stage PST2.

The above-described embodiments adopts the projection optical system PL which is used in a state that the first space K1 on a side of the lower surface T1 and the second space K2 on a side of the upper surface T2 of the first optical element LS1 are filled with the liquids, respectively. However, it is also possible to adopt a projection optical system PL which is used in a state that only the first space K1 on the side of the lower surface T1 of the first optical element LS1 of the projection optical system PL is filled with the liquid. In this case, the object to be observed by the observation unit 60 is only the first liquid immersion area LR1.

The observation unit 60 can be used not only for observing the liquid immersion areas LR1 and LR2 but also for observing the lower surface T1 of the first optical element LS1 of the projection optical system PL and/or observing the lower surface 70A of the nozzle member 70 and/or a lower surface of an objective lens of a substrate alignment system that is not shown. In this case, from an image obtained by using the observation unit 60, the pollution or contamination state of the lower surface T1 of the first optical element LS1, the holding portion of the first optical element LS1, the lower surface 70A of the nozzle member can be confirmed, and it is also possible to confirm whether or not the liquid (water) adheres to the lower surface of the objective lens of the substrate alignment system and the casing of the substrate alignment system.

Pure water is used as the liquid LQ in the embodiments. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at an end surface of the projection optical system PL. When the purity of the pure water supplied from the factory or the like is low, the exposure apparatus may be provided with an ultrapure water-producing unit.

When an image pickup device and/or a transmittance sensor is used to observe bubbles in the above-described embodiments, additives may be added to improve the sensitivity of the device and/or the sensor. For example, to clearly distinguish the bubbles and the liquid, a dye may be added to the liquid. In this case, it is desirable that the dye does not have an absorption band for the exposure light. A liquid added with such an additive may be used when observing the state of liquid immersion, and pure water added with no additive may be used for the actual exposure.

It is approved that the refractive index n of pure water (water) with respect to the exposure light beam EL having a wavelength of about 193 nm is approximately to an extent of 1.44. When the ArF excimer laser beam (wavelength: 193 nm) is used as the light source of the exposure light beam EL, the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is sufficient to secure an approximately equivalent depth of focus as compared with the case of the use in the air, it is possible to further increase the numerical aperture of the projection optical system PL. Also in this viewpoint, the resolution is improved.

To increase the numerical aperture in the liquid immersion method, it is considered that a liquid with a high refractive index, for example, a liquid with a refractive index of not less than 1.6 is used. In this case, to suppress the size (diameter) of the projection optical system PL, a part of the lenses of the projection optical system (in particular, the lens close to the image plane) is formed of a material with a high refractive index. For example, it is preferable that, among the optical elements in the projection optical system PL, the second optical element LS2 to come into contact with the second liquid LQ2 is made of at least one of CaO (calcium oxide) and MgO (magnesium oxide). Accordingly, a high numerical aperture can be realized with a practicable size. For example, even when the ArF excimer laser (wavelength: 193 nm) is used, a high numerical aperture of not less than 1.5 can be realized.

In the above-described embodiments, the first optical element LS1 arranged most closely to the image plane (substrate P side) is a plane-parallel having no refractive power. However, when this first optical element LS1 has a refractive power, it is preferable that this first optical element LS1 arranged most closely to the side of the image plane is made of at least one of CaO and MgO.

Namely, it is preferable that the projection optical system, which projects an image of an object onto the substrate through the liquid in the liquid immersion area formed on the side of the image plane, includes a first optical element which is disposed most closely to the side of the image plane and made of at least one of CaO (calcium oxide) and MgO (magnesium oxide). Also, it is preferable that the projection optical system, which projects an image of an object onto the substrate through the liquid in the liquid immersion area formed on the side of the image plane, includes a first optical element disposed most closely to the side of the image plane and a second optical element disposed adjacent to a side of an object of the first optical element, and at least one of the first optical element and the second optical element is made of at least one of CaO (calcium oxide) and MgO (magnesium oxide). For example, one of the first optical element LS1 and the second optical element LS2 is made of CaO (calcium oxide), and the other is made of MgO (magnesium oxide).

When the first optical element LS1 has a refractive power, the optical path space between the first optical element LS1 and the second optical element LS2 may not necessarily be filled with the second liquid LQ2.

CaO (calcium oxide) and MgO (magnesium oxide) have intrinsic birefringence for the wavelength (for example, 193 nm) of the exposure light beam EL. However, the signs of the intrinsic birefringence of the CaO (calcium oxide) and MgO (magnesium oxide) are opposite to each other. Therefore, when one of the optical elements close to the side of the image plane (substrate P side) of the projection optical system is made of CaO or MgO, it is preferable that another optical element in the vicinity of this optical element is made of MgO or CaO and the thicknesses in the optical axis direction of these optical elements are determined so as to reduce the influence of the intrinsic birefringence. Here, it is preferable that these optical elements have the same crystal orientation. The optical element made of CaO and the optical element made of MgO may not be adjacent to each other.

For example, when the second optical element LS2 is made of MgO (or CaO) and the third optical element LS3 is made of CaO (or MgO), it is preferable that the thickness in the optical axis direction of the second optical element LS2 and the thickness in the optical axis direction of the third optical element LS3 are determined to be approximately in proportion to the reciprocals of the values of intrinsic birefringence of CaO and MgO. In this case, the first optical element LS1 disposed most closely to the side of the image plane (substrate P side) can be made of quartz glass.

When the first optical element LS1 has a refractive power, it is also allowable that the first optical element LS1 is made of MgO (or CaO) and the second optical element LS2 is made of CaO (or MgO), and the thickness in the optical axis direction of the first optical element LS1 and the thickness in the optical axis direction of the second optical element LS2 are determined to be approximately in proportion to the reciprocals of the values of intrinsic birefringence of CaO and MgO.

When the optical element is made of CaO (calcium oxide), it is preferable that an antireflection coat containing MgO (magnesium oxide) is formed on the optical surface of this optical element. When the optical element is made of MgO (magnesium oxide), it is preferable that an antireflection coat containing CaO (calcium oxide) is formed on the optical surface of the optical element.

As described above, when the liquid immersion method is used, the numerical aperture NA of the projection optical system becomes 0.9 to 1.5 in some cases. In the case where the numerical aperture NA of the projection optical system is thus increased, the image formation performance is sometimes deteriorated by the polarization effect with the random polarized light beam having been hitherto used as the exposure light beam. Therefore, it is desirable to use the polarized illumination. In this case, the following procedure is preferred. That is, the linear polarized illumination is effected, which is adjusted to the longitudinal direction of the line pattern of the line-and-space pattern of the mask (reticle) so that a large amount of diffracted light of the S-polarized component (TE polarized component), that is, polarized light component along the longitudinal direction of the line pattern is allowed to outgo from the pattern of the mask (reticle). When the space between the projection optical system PL and the resist coated on the surface of the substrate P is filled with the liquid, the diffracted light of the S-polarized component (TE polarized component), which contributes to the improvement in the contrast, has the transmittance through the resist surface that is raised to be high as compared with a case in which the space between the projection optical system PL and the resist coated on the surface of the substrate P is filled with the air (gas). Therefore, even when the numerical aperture NA of the projection optical system exceeds 1.0, it is possible to obtain the high image formation performance. It is more effective to make an appropriate combination, for example, with the phase shift mask and the oblique incidence illumination method (especially the dipole illumination method) adjusted to the longitudinal direction of the line pattern as disclosed in Japanese Patent Application Laid-open No. 6-188169. In particular, the combination of the linear polarized illumination method and the dipole illumination method is effective when the periodic direction of the line-and-space pattern is limited to a predetermined one direction or the hole pattern is concentrated along a predetermined one direction. For example, in the case where the halftone phase shift mask (pattern with half pitch of 45 nm) with a transmittance of 6% is illuminated by combining the linear polarized illumination method and the dipole illumination method, when illumination $\sigma$ defined by a circumscribing circle of two light fluxes forming a dipole on the pupil plane of the illumination system is 0.95, the radiuses of the respective light fluxes on the pupil plane are 0.125 $\sigma$, and the numerical aperture of the projection optical system PL is NA=1.2, the depth of focus (DOE) can be increased by about 150 nm in comparison to the case using the random polarized light.

A combination of the linear polarized illumination and a small $\sigma$ illumination method (illumination method in which the value $\sigma$ indicating the ratio of the numerical aperture NAi of the illumination system and the numerical aperture NAp of the projection optical system becomes not more than 0.4) is also effective.

For example, when the surface of the substrate P is exposed with a fine line-and-space pattern (for example, lines-and-spaces of about 25 to 50 nm) by using, for example, the ArF excimer laser as an exposure light beam and a projection optical system PL having a reduction magnification of about ¼, then the mask M functions as a polarization plate on account of the Wave Guide effect depending on the structure (for example, fineness of the pattern and thickness of chromium) of the mask M, and a larger amount of diffracted light of S-polarized component (TE polarized component) is radiated from the mask M as compared with diffracted light of P-polarized component (TM polarized component) which lowers the contrast. In this case, it is desirable that the linear polarized illumination is used as described above. However, even when the mask M is illuminated with random polarized light and the numerical aperture NA of the projection optical system PL is as large, for example, 0.9 to 1.3, high resolution performance is obtained.

When the substrate P is exposed with an extremely fine line-and-space pattern on the mask M, there is also such a possibility that the P-polarized component (TM-polarized component) becomes larger than the S-polarized component (TE-polarized component) on account of the Wire Grid effect. However, for example, the substrate P is exposed with a line-and-space pattern larger than 25 nm by using the projection optical system PL with a reduction magnification of about ¼ and the ArF excimer laser as exposure light beam, a larger amount of diffracted light of the S-polarized component (TE-polarized component) is radiated from the mask M as compared with diffracted light of the P-polarized component (TM-polarized component). Therefore, high resolution performance can be obtained even when the numerical aperture NA of the projection optical system PL is large, for example, 0.9 to 1.3.

Further, it is also effective to use a combination of the oblique incidence illumination method and the polarized illumination method in which the linear polarization is effected in a tangential (circumferential) direction of a circle having a center of the optical axis as well as the linear polarized illumination (S-polarized illumination) adjusted to the longitudinal direction of the line pattern of the mask (reticle), as disclosed in Japanese Patent Application Laid-open No. 6-53120. In particular, when the pattern of the mask (reticle) includes not only the line pattern which extends in a predetermined one direction but the pattern also includes line patterns which extend in a plurality of directions in a mixed manner (mixed with a line-and-space pattern with varied periodic directions), then the high image formation performance can be obtained even when the numerical aperture NA of the projection optical system is large, by using, in combination, the zonal illumination method and the polarized illumination method in which the linear polarization is effected in the tangential direction of the circle having a center of the optical axis, as disclosed in Japanese Patent Application Laid-open No. 6-53120. For example, when the halftone phase shift mask (pattern with half pitch of about 63 nm) with a transmittance of 6% is illuminated by using, in combination, the polarized illumination method in which the linear polarization is effected in the tangential direction of the circle centered at the optical axis and the zonal illumination method (zone ratio: 3/4), in the case where illumination σ is 0.95 and the numerical aperture of the projection optical system PL is NA=1.00, the depth of focus (DOF) can be increased by about 250 nm in comparison to the case using the random polarized light, and in the case where the pattern has half pitch of about 55 nm and the numerical aperture NA of the projection optical system is NA=1.2, the depth of focus can be increased by about 100 nm.

Furthermore, in addition to the respective illumination methods described above, application of the progressive focus exposure method disclosed in, for example, Japanese Patent Application Laid-open No. 4-277612 and Japanese Patent Application Laid-open No. 2001-345245 and the multiwavelength exposure method in which the same effect as that of the progressive focus exposure method by using exposure light beam of multiple wavelengths (for example, two wavelengths) is also effective.

In the embodiments described above, the optical element LS1 is attached to the end portion of the projection optical system PL, and by this lens, the optical characteristics of the projection optical system PL including the aberration (for example, spherical aberration and coma aberration) can be adjusted. As an optical element to be attached to the end portion of the projection optical system PL, an optical plate to be used for adjusting the optical characteristics of the projection optical system PL can also be used. Alternatively, the optical plate may be a plane-parallel through which the exposure light beam EL is transmissive.

When the pressure, which is generated by the flow of the liquid LQ, is great between the substrate P and the optical element disposed at the end portion of the projection optical system PL, it is also allowable that the optical element is tightly fixed so that the optical element is not moved by the pressure, instead of allowing the optical element to be exchangeable.

Each of the embodiments of the present invention is constructed such that the space between the projection optical system PL and the surface of the substrate P is filled with the liquid LQ. However, for example, another construction may be adopted such that the space is filled with the liquid LQ in a state in which a cover glass formed of a plane-parallel is attached to the surface of the substrate P.

In the above-described embodiments, the liquid LQ is water, in particular, pure water. However, the liquid LQ may be a liquid other than water. For example, when the light source of the exposure light beam EL is an $F_2$ laser, the $F_2$ laser beam is not transmitted through water. Therefore, the liquid LQ may be, for example, a fluorine-based fluid such as perfluoropolyether (PFPE) and fluorine-based oil through which the $F_2$ laser beam is transmissive. In this case, the portion which makes contact with the liquid LQ is subjected to the liquid-attracting treatment by forming a thin film, for example, with a substance having a molecular structure with small polarity including fluorine. Alternatively, other than above, it is possible to use, as the liquid LQ, liquids (for example, cedar oil), which have a transmittance with respect to the exposure light beam EL, which have a refractive index as high as possible, and which are stable with respect to the photoresist coated on the projection optical system PL and the surface of the substrate P. Also in this case, the surface treatment is performed according to the polarity of the liquid LQ to be used. In place of pure water for the liquid LQ, it is also possible to use various fluids having desired refractive indexes, for example, any supercritical fluid or any gas having a high refractive index.

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic silica glass, silicon wafer) for the mask or the reticle to be used for the As for the exposure apparatus EX, the present invention is also applicable to the scanning type exposure apparatus (scanning stepper) based on the step-and-scan system for performing the scanning exposure for the pattern of the mask M by synchronously moving the mask M and the substrate P as well as the projection exposure apparatus (stepper) based on the step-and-repeat system for performing the full field exposure for the pattern of the mask M in a state in which the mask M and the substrate P are allowed to stand still, while successively step-moving the substrate P.

As for the exposure apparatus EXS, the present invention is also applicable to the exposure apparatus of such a system that the substrate P is subjected to the full field exposure with a reduction image of a first pattern in a state in which the first pattern and the substrate P are allowed to substantially stand still by using a projection optical system (for example, a dioptric type projection optical system having a reduction magnification of ⅛ and including no catoptric element). In this case, the present invention is also applicable to the full field exposure apparatus based on the stitch system in which the substrate P is thereafter subjected to the full field exposure with a reduction image of a second pattern while being partially overlaid with the first pattern in a state in which the second pattern and the substrate P are allowed to substantially stand still by using the projection optical system. As for the exposure apparatus based on the stitch system, the present invention is also applicable to the exposure apparatus based on the step-and-stitch system in which at least two patterns are partially overlaid and transferred on the substrate P, and the substrate P is successively moved.

The present invention is also applicable to a twin-stage type exposure apparatus. In the case of the twin-stage type exposure apparatus, at least a part of the observation unit 60 may be provided in each of the two substrate stages holding substrates respectively, or at least a part of the observation unit 60 may be provided in only one of the substrate stages. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference within a range of permission of the domestic laws and ordinances of the state designated or selected in this international application.

In the above-described embodiment, the explanation is given about a case in which the present invention is applied to the exposure apparatus including a measuring stage and a substrate stage. However, the present invention is also applicable to an exposure apparatus which includes only one substrate stage but including no measuring stage. In this case, as explained in the third embodiment, at least a part of the observation unit 60 is provided to the substrate stage.

In the embodiments described above, the transparent member 64, the optical system 61, and the image pickup device 63 are provided in the substrate stage and the measuring stage. However, for example, as disclosed in Japanese Patent Application Laid-open No. 10-284412, it is also allowable that the transparent member 64 is arranged on the stage and the image pickup device 63 is arranged on a member (for example, base BP) provided separately or away from the stage so that the image pickup device 63 receives light via the transparent member 64 to observe the state of the liquid (LQ1, LQ2) forming the liquid immersion area (LR1, LR2).

In the third embodiment shown in FIG. 8, the transparent member 64, the optical system 61, and the image pickup device 63 are provided in the substrate stage PST1. However, it is also allowable that the transparent member 64 and a first light sending system are arranged in the substrate stage PST1 and a second light transmitting system and the image pickup device 63 are provided in the measuring stage PST2 so that the image pickup device 63 receives light via the second light transmitting system, which has been made incident on the first light sending system via the transparent member 64, to observe the states of the liquids (LQ1 and LQ2) forming the liquid immersion areas (LR1 and LR2) in a state that the substrate stage PST1 and the measuring stage PST2 satisfy a predetermined positional relationship.

In the fourth embodiment described above, bubbles (gas portions) are detected by using the observation unit 60 including the image pickup device 63, and when bubbles are detected, the bubbles are reduced or eliminated by supplying degassed liquid. However, the method for detecting the bubbles (gas portions) is not limited to the method using the image pickup device 63, and it is also allowable that the bubbles are detected by another method and degassed liquid is supplied. For example, it is also allowable that a light receiving element is arranged instead of the image pickup device, the liquid immersion area is irradiated with light by the method exemplified in the fifth embodiment and the transmittance of light transmitted through the liquid immersion area is detected by the light receiving element. In this case, a transmittance in the case where the bubbles fall within a permissible range is obtained in advance as a reference value, and the amount of bubbles can be judged by comparing a detected value with the reference value. The position where this light receiving element is arranged is not limited to the position below or under the projection optical system (optical axis position), and may be a position deviating or away from the optical axis of the projection optical system as in the case of the bubble detector disclosed in WO 2004/053958.

Further, it is also possible that a part or the whole of the observation unit 60 is made attachable to and detachable from the measuring stage and the substrate stage.

The observation unit which observes the state of the first liquid immersion area LR1 from the position lateral to the first liquid LQ1 may be arranged inside the exposure apparatus EX (as a part or component of the exposure apparatus), or may be a unit separate from the exposure apparatus (for example, optional module).

The embodiments described above adopt the exposure apparatus in which a liquid is locally filled between the projection optical system PL and the substrate P. However, the present invention is also applicable to a liquid immersion exposure apparatus in which the entire surface of the substrate to be exposed is covered by a liquid. The structure and exposure operation of the liquid immersion exposure apparatus in which the entire surface of the substrate to be exposed is covered by a liquid are disclosed in, for example, Japanese Patent Application Laid-open No. 6-124873, Japanese Patent Application Laid-open No. 10-303114, and U.S. Pat. No. 5,825,043, contents of which are incorporated herein by reference within a range of permission of the domestic laws and ordinances of the state designated or selected in this international application.

As for the type of the exposure apparatus EX, the present invention is not limited to the exposure apparatus for the semiconductor device production which exposes the semiconductor device pattern on the substrate P. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

In the above-described embodiments, a light-transmissive type mask including a predetermined light-shielding pattern (or phase pattern, or a light-reducing pattern or a dimming pattern) formed on a light-transmissive transmission substrate is used. However, instead of this mask, for example, as disclosed in U.S. Pat. No. 6,778,257, it is also allowable to use an electronic mask for forming a transmissive pattern, a reflective pattern, or a light-emitting pattern based on electronic data of the pattern to be exposed.

The exposure apparatus of the present invention is also applicable to an exposure apparatus including no projection optical system. In this case, an exposure light beam from a light source is irradiated onto the liquid immersion area after passing through the optical elements. The present invention is also applicable to an exposure apparatus (photolithography system) which exposes the substrate P with a line-and-space pattern by forming an interference pattern on the substrate P, as disclosed in International Publication Pamphlet No. 2001/035168.

As described above, the exposure apparatus EX according to the embodiment of the present invention is produced by assembling the various subsystems including the respective constitutive elements as defined in the claims of this application so that the predetermined mechanical accuracy, the electric accuracy, and the optical accuracy are maintained. In order to secure the various accuracies, adjustments performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It is as a matter of course that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the degree of cleanliness are managed.

Figure 18:
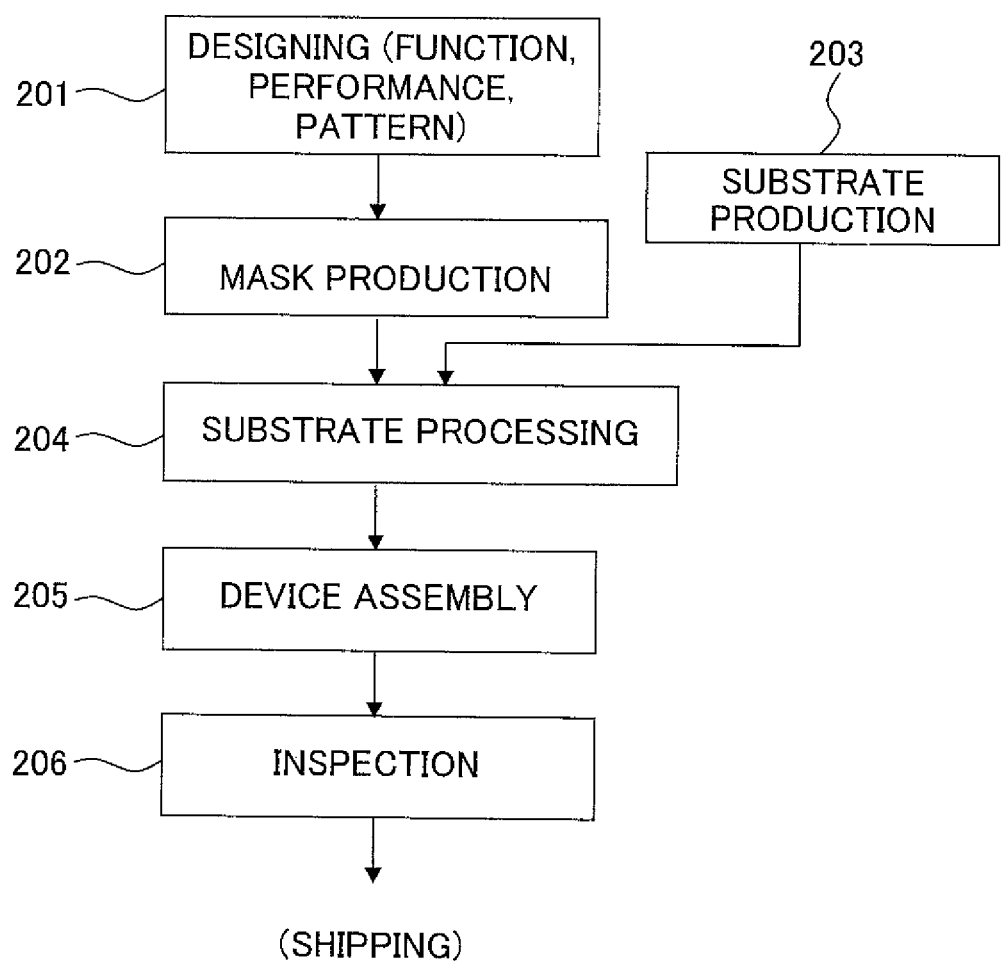
FIG. 18 is a flowchart illustrating an example of a semiconductor device production process.

As shown in FIG. 18, the microdevice such as the semiconductor device is produced by performing, for example, a step 201 of designing the function and the performance of the microdevice, a step 202 of producing a mask (reticle) based on the designing step, a step 203 of producing a substrate as a base material for the device, an exposure process step 204 of exposing the substrate with a pattern of the mask by using the exposure apparatus EX of the embodiment described above, a step 205 of assembling the device (including processing steps such as a dicing step, a bonding step, and a packaging step), and an inspection step 206. The exposure process step includes processes of observing and taking measures for the liquid immersion areas described in FIG. 5, FIG. 9, and FIG. 10 and a substrate developing process.

INDUSTRIAL APPLICABILITY

According to the invention, appropriate or suitable processes are performed by grasping the states of the liquid immersion areas, especially the presence of gases in the liquids in the liquid immersion areas, thereby optimizing the states of the liquid immersion area or areas at the time of actual exposure. Therefore, satisfactory liquid immersion exposure is realized.

The invention claimed is:

1. An exposure apparatus which exposes a substrate through a liquid in a liquid immersion area, the exposure apparatus comprising:
a projection optical system including a first optical element disposed closest to an image plane of the projection optical system;
a liquid immersion system including a nozzle member configured to form the liquid immersion area of the liquid in a space between the first optical element and a surface provided on a side of the image plane of the projection optical system;
an observation unit which observes a lower surface of the nozzle member; and
a control unit configured to confirm a contamination state of the lower surface of the nozzle member based on an output of the observation unit.

2. The exposure apparatus according to claim 1, wherein the observation unit obtains image data concerning the lower surface of the nozzle member.

3. The exposure apparatus according to claim 1, wherein the observation unit observes the lower surface of the nozzle member via a predetermined surface disposed on the side of the image plane of the projection optical system.

4. The exposure apparatus according to claim 3, wherein the predetermined surface includes a surface of a transparent member, and the observation unit observes the lower surface of the nozzle member via the transparent member.

5. The exposure apparatus according to claim 3, further comprising a first stage configured to be movable on the side of the image plane of the projection optical system,
wherein an upper surface of the first stage includes the predetermined surface.

6. The exposure apparatus according to claim 5, wherein at least part of the observation unit is provided inside the first stage.

7. The exposure apparatus according to claim 5, wherein the first stage is configured to be movable while holding the substrate.

8. The exposure apparatus according to claim 3, further comprising:
a first stage configured to be movable on the side of the image plane of the projection optical system, and
a second stage configured to be movable independently from the first stage,
wherein the first stage moves while holding the substrate, the second stage moves while holding a measuring instrument which performs measurement concerning an exposure process, and an upper surface of the second stage includes the predetermined surface.

9. The exposure apparatus according to claim 1, further comprising a first stage and a second stage each of which is configured to be movable on the side of the image plane of the projection optical system,
wherein the first and second stages are moved together in a state in which the first and second stages are close to each other so as to move the liquid immersion area formed under the projection optical system between an upper surface of the first state and an upper surface of the second stage.

10. The exposure apparatus according to claim 9, wherein the first stage is configured to be movable while holding the substrate, and at least a part of the observation unit is provided inside the second stage.

11. The exposure apparatus according to claim 9, wherein the first stage is configured to be movable while holding the substrate, and the second stage is arranged not to hold any substrate.

12. The exposure apparatus according to claim 9, wherein the liquid immersion area is moved from the upper surface of the first stage to the upper surface of the second stage when the first stage is moved away from a position under the projection optical system.

13. The exposure apparatus according to claim 9, wherein the liquid immersion area is moved from the upper surface of the second stage to the upper surface of the first stage when the first stage is moved to a position under the projection optical system.

14. The exposure apparatus according to claim 1, wherein the observation unit has a field of view and performs observation while moving the observation unit.

15. The exposure apparatus according to claim 1, wherein the observation unit includes a display unit arranged to display an image of the lower surface of the nozzle member.

16. The exposure apparatus according to claim 15, wherein the observation unit includes an image pickup device.

17. The exposure apparatus according to claim 1, wherein the liquid immersion system includes a degassing unit which degasses the liquid, the observation unit is capable of observing a state of the liquid immersion area, and the control unit controls the liquid immersion system so as to supply degassed liquid under a situation in which a gas portion is present in the liquid immersion area.

18. The exposure apparatus according to claim 1, wherein the observation unit includes an illumination unit which illuminates the lower surface of the nozzle member.

19. A method used in an exposure apparatus which exposes a substrate through a liquid in a liquid immersion area, the exposure apparatus including a projection optical system which has a first optical element disposed closest to an image plane of the projection optical system, and a liquid immersion system which has a nozzle member configured to form the liquid immersion area of the liquid in a space between the first optical element and a surface provided on a side of the image plane of the projection optical system, the method comprising:

observing a lower surface of the nozzle member; and
confirming a contamination state of the lower surface of the nozzle member.

* * * * *